(12) United States Patent
Miyauchi et al.

(10) Patent No.: US 8,539,322 B2
(45) Date of Patent: Sep. 17, 2013

(54) DATA PROCESSING APPARATUS AND METHOD, AND PROGRAM

(75) Inventors: Toshiyuki Miyauchi, Kanagawa (JP); Naoki Yoshimochi, Kanagawa (JP)

(73) Assignee: Sony Corporation, Tokyo (JP)

( * ) Notice: Subject to any disclaimer, the term of this patent is extended or adjusted under 35 U.S.C. 154(b) by 232 days.

(21) Appl. No.: 13/125,111

(22) PCT Filed: Oct. 27, 2009

(86) PCT No.: PCT/JP2009/068357
§ 371 (c)(1),
(2), (4) Date: Apr. 20, 2011

(87) PCT Pub. No.: WO2010/050446
PCT Pub. Date: May 6, 2010

(65) Prior Publication Data
US 2011/0246863 A1    Oct. 6, 2011

(30) Foreign Application Priority Data
Oct. 27, 2008 (JP) ................. P2008-275173

(51) Int. Cl.
*H03M 13/03* (2006.01)

(52) U.S. Cl.
USPC ........................................ 714/788

(58) Field of Classification Search
None
See application file for complete search history.

(56) References Cited

U.S. PATENT DOCUMENTS

| | | | | |
|---|---|---|---|---|
| 5,627,935 A | * | 5/1997 | Kim | ............................. 386/263 |
| 5,778,139 A | * | 7/1998 | Kim | ............................. 386/200 |
| 6,289,000 B1 | | 9/2001 | Yonge, III | |
| 8,194,750 B2 | * | 6/2012 | Xia et al. | ................. 375/240.24 |
| 2002/0019966 A1 | * | 2/2002 | Yagil et al. | .................... 714/752 |
| 2002/0026617 A1 | | 2/2002 | Kojima | |
| 2004/0054651 A1 | | 3/2004 | Katayama et al. | |
| 2006/0107173 A1 | | 5/2006 | Kondou et al. | |
| 2007/0290908 A1 | | 12/2007 | Esumi et al. | |
| 2008/0089427 A1 | * | 4/2008 | Xia et al. | ................. 375/240.24 |

FOREIGN PATENT DOCUMENTS

| | | |
|---|---|---|
| EP | 1 182 785 | 2/2002 |
| JP | 2002 74862 | 3/2002 |
| JP | 2004 193727 | 7/2004 |

(Continued)

OTHER PUBLICATIONS

Chaehag Yi et al.: "Interleaving and Decoding Scheme for a product Code for a Mobile Data Communication", IEEE Transactions on Communications, IEEE Service Center, Piscataway, NJ, USA, vol. 45, No. 2, Feb. 1, 1997, XP011008894 ISSN: 0090-6778.

*Primary Examiner* — Guerrier Merant
(74) *Attorney, Agent, or Firm* — Frommer Lawrence & Haug LLP; William S. Frommer

(57) ABSTRACT

The present invention relates to data processing apparatus and method, and a program which make it possible to scatter burst errors with respect to both codes of a product code.
A block-wise interleaver performs interleaving A, which is a process of inputting data in the order of the column direction as one direction, and reading the data in the order of the direction diagonally downward to the right, NB bits by NB bits (=block by block) with respect to ND×NB×NA bits of a product code. Next, the block-wise interleaver performs interleaving B, which is a process of inputting data in the order of the column direction as one direction, and reading the data in the order of the row direction as the other direction, NB bits by NB bits with respect to (NC−ND)×NB×NA bits representing the parity portion of an inner code indicated by P, of the product code. The present invention can be applied to, for example, a recording/reproducing apparatus.

20 Claims, 17 Drawing Sheets

(56) References Cited

FOREIGN PATENT DOCUMENTS

| JP | 2006 148366 | 6/2006 |
| JP | 2007 87529 | 4/2007 |
| JP | 2007149340 | 6/2007 |
| WO | WO 2008/045292 | 4/2008 |

* cited by examiner

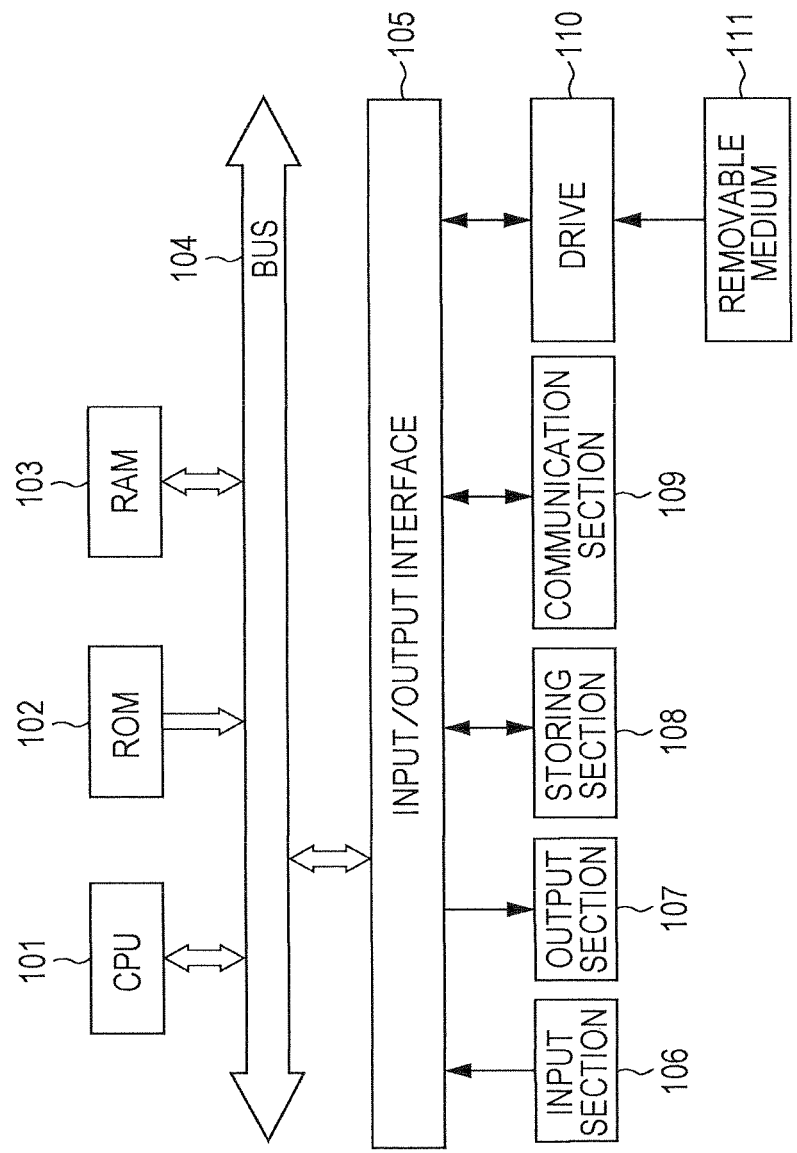

DATA PROCESSING APPARATUS AND METHOD, AND PROGRAM

TECHNICAL FIELD

The present invention relates to data processing apparatus and method, and a program, in particular, data processing apparatus and method, and a program which make it possible to scatter burst errors with respect to both codes of a product code.

BACKGROUND ART

In the case of recording a signal to a recording medium such as a magnetic disk or an optical disc in a recording apparatus, the recording is done after performing modulation encoding in advance so that amplitude control of a read signal and clock recovery operate properly at the time of reproduction. Then, for reproduction in such a case, for example, a reproduction method such as PRML (Partial Response Maximum-Likelihood) is employed. PRML is a reproduction method that reproduces the original waveform by taking into consideration such media property that a reproduced signal is affected by the immediately previous signal, and reads the most likely data from the reproduced signal on the basis of the characteristics of a recorded signal.

When errors are contained in the reproduced signal, the errors can be corrected by an error correcting code. It should be noted, however, that if burst errors have occurred in the reproduced signal, the rate of error correction using the error correcting code becomes lower, and hence it is desirable to scatter the burst errors prior to decoding.

For burst errors on optical discs, two kinds of causes are conceivable. One of the causes is that errors that are random at the time of reading become a short burst error of about several bits due to error propagation in PRML, Viterbi decoding, or the like. The other cause is that reading fails due to scratches, dust, or the like on a disc, resulting in a long burst error of about 1000 bits.

A scheme called product code exists as a scheme for dealing with these burst errors. Product code is a scheme which performs error correction by two kinds of code, and is used in cases where some decoding delay is tolerated and, further, a desired performance cannot be attained with a single code. Also, product code is a scheme which can provide a powerful error correction capability with relatively simple hardware, and is adopted as an error correction scheme for CD-ROM (Compact Disc Read Only Memory) and DVD (Digital Versatile Disc) (see, for example, PTL 1).

FIG. 1 represents an example of the data configuration of a product code. The product code is made up of user data, the parity of the outer code, the parity of the inner code, and the parity of the parity (of the outer code).

In the product code illustrated in FIG. 1, encoding of the inner code is performed after encoding of the outer code is performed. That is, encoding of the outer code is performed in the row direction from top to bottom in the drawing, as indicated by the down-arrow representing the encoding direction of the outer code. As a result, in the product code, the parity of the outer code is added below the user data. Thereafter, encoding of the inner code is performed in the column direction from left to right in the drawing, as indicated by the rightward arrow representing the encoding direction of the inner code. As a result, in the product code, the parity of the parity is added to the right of the parity of the outer code.

Decoding of the product code configured in this way first begins with decoding of the inner code that is the first kind of code. Even if decoding of the inner code fails, the resulting error is scattered over a plurality of codewords of the outer code that is the second kind of code. Therefore, even in the case of a long burst error, the burst error can be corrected as a random error with respect to the outer code.

Here, as error correcting codes for performing bit-wise decoding, there are a turbo code, an LDPC (Low Density Parity Check) code, and the like as high-performance error correcting codes whose implementation has progressed for applications such as communication and broadcasting. Use of these codes can provide a large coding gain, thus enabling high quality transmission.

As an error correcting code for performing symbol-wise decoding, there are an RS (Reed-Solomon) code and the like. An RS(n, k) code (n: code length, k: information length) that encodes k symbols into n symbols is capable of correcting errors up to the number of corrections (n−k)/2 symbols by bounded distance decoding.

Therefore, in the case where an error correcting code for performing bit-wise decoding is used as the inner code of the product code, and an error correcting code for performing symbol-wise decoding is used as the outer code, error-free is achieved by reducing the number of errors after decoding of the inner code to be equal to or less than the number of corrections of the outer code. This enables very powerful error correction.

A channel interleaver is used to change burst errors into random errors prior to decoding of each of these codes to thereby enhance the probability of decoding.

FIG. 2 represents an example of interleaving by an interleaver according to the related art, and an example of deinterleaving performed in correspondence to the interleaving. It should be noted that A of FIG. 2 represents an example of interleaving. B of FIG. 2 represents an example of deinterleaving in the case where a short burst error has occurred after interleaving in A of FIG. 2. C of FIG. 2 represents an example of deinterleaving in the case where a long burst error has occurred after interleaving in A of FIG. 2.

In the example in A of FIG. 2, for the convenience of description, the bits prior to interleaving are grouped into blocks of 8 bits, and the blocks are respectively referred to as A-block, B-block, C-block, D-block, and so on, in order from the beginning (left). Likewise, the bits after interleaving are grouped into blocks of 8 bits, and the blocks are respectively referred to as a-block, b-block, c-block, d-block, and so on, in order from the beginning (left).

For example, the channel interleaver performs interleaving so that the first bit of the A-block, the first bit of the B-block, the first bit of the C-block, and the first bit of the D-block prior to interleaving become the first to fourth bits of the a-block, respectively. The channel interleaver performs interleaving so that the second bit of the A-block, the second bit of the B-block, the second bit of the C-block, and the second bit of the D-block prior to interleaving become the first to fourth bits of the b-block, respectively.

On the other hand, deinterleaving is rearranging in the direction opposite to this interleaving. That is, the first to fourth bits of the first of the a-block are deinterleaved so as to become the first bit of the A-block, the first bit of the B-block, the first bit of the C-block, and the first bit of the D-block, respectively.

Thus, as illustrated in B of FIG. 2, even if a short burst error has occurred in the first to sixth bits after interleaving, after deinterleaving, the first to sixth bits in which the short burst error has occurred are each rearranged in its original position, and scattered. Therefore, the error can be changed into a random error with respect to the outer code for performing decoding in units of blocks.

However, as illustrated in C of FIG. 2, in the case where a long burst error has occurred after interleaving (35 bits in the case of the example in C of FIG. 2), the error remains to be a long burst error even after deinterleaving, and it is difficult to change the error into a random error with respect to the outer code. Therefore, in the case where a long burst error has occurred, there is a high possibility that error correction by the inner code fails, and hence there is a need for a channel interleaver that changes a long burst error into a random error with respect to the inner code as much as possible.

On the other hand, there also exists a channel interleaver that scatters a long burst error only with respect to the inner code.

FIG. 3 represents an example of interleaving by a channel interleaver that scatters a long burst error only with respect to the inner code, and deinterleaving corresponding to the interleaving.

The product code in the example in FIG. 3 is made up of the first to fifth pieces of the inner code, and each piece of the inner code has a code length of 35 bits. In FIG. 3, in order from the top, the product code prior to interleaving, the product code after interleaving, the product code after interleaving in the case where a long burst error has occurred, and the product code after deinterleaving in the case where a long burst error has occurred are illustrated.

In the product code prior to interleaving, the circle marks illustrated in the first inner code represent bits of the first inner code, and the × marks illustrated in the second inner code represent bits of the second inner code. Likewise, the upward-pointing triangle marks illustrated in the third inner code represent bits of the third inner code, the square marks illustrated in the fourth inner code represent bits of the fourth inner code, and the downward-pointing triangle marks illustrated in the fifth inner code represent bits of the fifth inner code.

As indicated by the solid arrows representing the input direction, the channel interleaver in FIG. 3 inputs the bits of the first inner code in order from the left to a buffer to accumulate the bits, and then inputs the bits of the second inner code in order from the left to the buffer to accumulate the bits. Thereafter, likewise, with respect to the third to fifth pieces of the inner code, the channel interleaver inputs bits in order from the left to the buffer to accumulate the bits.

Then, the channel interleaver outputs bits in the order indicated by the dashed arrows representing the output direction. That is, the channel interleaver outputs the bit at the beginning of each of the first to fifth pieces of the inner code in order, and then outputs the second bit from the beginning of each of the first to fifth pieces of the inner code in order, and outputs the third bit from the beginning of each of the first to fifth pieces of the inner code in order. Thereafter, likewise, the fourth to thirty-fifth bits from the beginning of each of the first to fifth pieces of the inner code are outputted in order.

Interleaving is performed in the above-described manner, and as a result, the bits are rearranged as illustrated in the interleaved product code. However, suppose that, after interleaving is performed, as indicated by E, a long burst error has occurred during the period from the bit at the beginning to the thirty-first bit on the top row.

In this case, when deinterleaving corresponding to the interleaving mentioned above is performed, as illustrated in the deinterleaved product code, the burst error can be scattered to some extent with respect to the first to fifth pieces of the inner code. However, on the first to fifth columns from the left, the burst distribution becomes tightly clustered in the row direction from top to bottom.

That is, with the method of interleaving in FIG. 3, although it is possible to scatter a long burst error to some extent only with respect to the inner code, it is not possible to scatter the burst error with respect to the outer code for performing decoding in the row direction from top to bottom. For this reason, the error becomes a burst error with respect to the outer code, which increases the probability of failure of error correction by the outer code.

Therefore, there is a need for an interleaver which can change a short burst error into a random error prior to decoding of the inner code, and change a long burst error into a random error as much as possible prior to decoding of the inner code, so that even if error correction by the inner code fails, the error can be treated as a random error with respect to the outer code.

Citation List

Patent Literature

PTL 1: Japanese Unexamined Patent Application Publication No. 2007-149340

SUMMARY OF INVENTION

Technical Problem

As described above, in the case of employing a product code that uses a code for performing symbol-wise decoding as an outer code, and a code for performing bit-wise decoding as an inner code, it is desirable that errors be scattered prior to decoding of each of the codes. For this reason, there has been a need for an interleaver that can change a short burst error into a random error prior to decoding of the inner code, and change a long burst error into a random error as much as possible prior to decoding of the inner code, so that even if error correction by the inner code fails, the error can be treated as a random error with respect to the outer code.

However, to date, no interleaver has been proposed which can change a short burst error into a random error with respect to the inner code, and also change a long burst error into a random error with respect to both codes.

The present invention has been made in view of the above-mentioned circumstances, and makes it possible to scatter burst errors with respect to both codes of a product code.

Solution to Problem

A data processing apparatus according to an aspect of the present invention includes interleaving means for performing interleaving on a product code to change a recording order, the product code being encoded in the order of an outer code and an inner code by using, as the outer code, a code that performs error correction in units of symbols with n bits as one symbol, and using, as the inner code, a code that performs error correction in units of bits, in which in the recording order after the interleaving is performed by the interleaving means, the same codeword of the inner code is not included in i consecutive bits, and j (j>i) consecutive bits do not span a plurality of symbols of the same codeword of the outer code.

The interleaving means can include a first interleaving means for performing first interleaving of NA×NC blocks with NB (NB=n) bits as one block, by using NA pieces of the inner code, and a second interleaving means for performing second interleaving of NA×NB bits NC times in units of bits, after the first interleaving by the first interleaving means.

The first interleaving means can perform the first interleaving by outputting the NA×NC blocks, which are inputted in the order of one direction, in the order of a diagonal direction.

The first interleaving by the first interleaving means includes interleaving in units of ND×NB×NA bits (ND× NB≧information length of the inner code), and interleaving of a portion other than that, and the first interleaving means can perform the first interleaving by outputting NA×ND blocks, which are inputted in the order of one direction, in the order of a diagonal direction, with respect to a range of the ND×NB×NA bits, and then outputting NA×(NC−ND) blocks, which are inputted in the order of the one direction, in the order of the other direction, with respect to a range of (NC−ND)×NB×NA bits.

NA and ND are disjoint.

Letting the index of blocks generated by dividing the inner code in units of NB bits be x=0, 1, ..., ND−1 in serial order, letting the index of the inner code be y=0, 1, ..., NA−1 in serial order, letting the x-th block of the y-th inner code be (x, y), and letting k be a variable that counts the number of blocks to be read, with respect to the range of the ND×NB×NA bits, the first interleaving means can output, from the inner code with the smallest index, the blocks inputted in ascending order of the index of the blocks, in the order of blocks (x, y) represented by $$x = (k \bmod ND)$$

$$y = (k \bmod NA)$$

$$k = 0, 1, 2, \ldots, N-1.$$

The second interleaving means can perform the second interleaving by performing processing in serial order NA blocks by NA blocks, with respect to the blocks whose recording order has been changed by the first interleaving means, and outputting, within a range of the NA blocks, the first bit of each of the blocks in order, then outputting the second bit of each of the blocks in order, thereafter repeating the same processing, and lastly, outputting the NB-th bit of each of the blocks in order.

A cycle of the interleaving is smaller than one codeword of the product code.

A data processing method according to an aspect of the present invention includes the step of a data processing apparatus that performs interleaving on a product code encoded in the order of an outer code and an inner code by using, as the outer code, a code that performs error correction in units of symbols with n bits as one symbol, and using, as the inner code, a code that performs error correction in units of bits: performing the interleaving on the product code to change a recording order, so that in the recording order after the interleaving is performed, the same codeword of the inner code is not included in i consecutive bits, and j (j>i) consecutive bits do not span a plurality of symbols of the same codeword of the outer code.

A program according to an aspect of the present invention causes a data processing apparatus to execute processing, the data processing apparatus performing interleaving on a product code encoded in the order of an outer code and an inner code by using, as the outer code, a code that performs error correction in units of symbols with n bits as one symbol, and using, as the inner code, a code that performs error correction in units of bits, the processing including the step of performing the interleaving on the product code to change a recording order, so that in the recording order after the interleaving is performed, the same codeword of the inner code is not included in i consecutive bits, and j (j>i) consecutive bits do not span a plurality of symbols of the same codeword of the outer code.

A data processing apparatus according to another aspect of the present invention includes deinterleaving means for performing deinterleaving on data read from a recording medium on which the data is recorded, to rearrange the data into an original order, the data being obtained by performing interleaving on a product code, which is encoded in the order of an outer code and an inner code by using, as the outer code, a code that performs error correction in units of symbols with n bits as one symbol, and using, as the inner code, a code that performs error correction in units of bits, so that in a recording order after the interleaving is performed, the same codeword of the inner code is not included in i consecutive bits, and j (j>i) consecutive bits do not span a plurality of symbols of the same codeword of the outer code.

The deinterleaving means can include a first deinterleaving means for performing first deinterleaving of NA×NB bits NC times in units of bits, and a second deinterleaving means for performing second deinterleaving of NA×NC blocks with NB (NB=n) bits as one block, by using NA pieces of the inner code, after the first deinterleaving by the first deinterleaving means.

The second deinterleaving means can perform the first deinterleaving by outputting the NA×NC blocks, which are inputted in the order of a diagonal direction, in the order of one direction.

The second deinterleaving by the second deinterleaving means includes deinterleaving in units of ND×NB×NA bits (ND×NB information length of the inner code), and deinterleaving of a portion other than that, and the second deinterleaving means can perform the first deinterleaving by outputting the NA×NC blocks, which are inputted in the order of a diagonal direction, in the order of one direction, with respect to a range of the ND×NB×NA bits, and then outputting NA× (NC−ND) blocks, which are inputted in the order of the other direction, in the order of the one direction, with respect to a range of (NC−ND)×NB×NA bits.

NA and ND are disjoint.

Letting the index of blocks generated by dividing the inner code in units of NB bits be x=0, 1, ..., ND−1 in serial order, letting the index of the inner code be y=0, 1, ..., NA−1 in serial order, letting the x-th block of the y-th inner code be (x, y), and letting k be a variable that counts the number of blocks to be inputted, with respect to the range of the ND×NB×NA bits, the second deinterleaving means can input blocks (x, y) represented by $$x = (k \bmod ND)$$

$$y = (k \bmod NA)$$

$$k = 0, 1, 2, \ldots, N-1$$

in order, and output them in ascending order of the index of the blocks, from the inner code with the smallest index.

The first deinterleaving means can perform the second deinterleaving by performing processing in serial order NB blocks by NB blocks with NA bits as one block, and outputting, within a range of the NB blocks, the first bit of each of the blocks in order, then outputting the second bit of each of the blocks in order, thereafter repeating the same processing, and lastly, outputting the NA-th bit of each of the blocks in order.

A cycle of the interleaving is smaller than one codeword of the product code.

A data processing method according to another aspect of the present invention includes the step of a data processing apparatus that processes data read from a recording medium on which the data is recorded, the data being obtained by performing interleaving on a product code encoded in the order of an outer code and an inner code by using, as the outer code, a code that performs error correction in units of symbols with n bits as one symbol, and using, as the inner code, a code that performs error correction in units of bits: performing deinterleaving on data to rearrange the data into an original order, the data being read from the recording medium and subjected to the interleaving so that in a recording order after the interleaving is performed, the same codeword of the inner code is not included in i consecutive bits, and j (j>i) consecutive bits do not span a plurality of symbols of the same codeword of the outer code.

A program according to another aspect of the present invention causes a data processing apparatus to execute processing, the data processing apparatus processing data read from a recording medium on which the data is recorded, the data being obtained by performing interleaving on a product code encoded in the order of an outer code and an inner code by using, as the outer code, a code that performs error correction in units of symbols with n bits as one symbol, and using, as the inner code, a code that performs error correction in units of bits, the processing including the step of performing deinterleaving on data to rearrange the data into an original order, the data being read from the recording medium and subjected to the interleaving so that in a recording order after the interleaving is performed, the same codeword of the inner code is not included in i consecutive bits, and j (j>i) consecutive bits do not span a plurality of symbols of the same codeword of the outer code.

According to an aspect of the present invention, interleaving is performed on a product code encoded in the order of an outer code and an inner code, so that in the recording order after the interleaving is performed, the same codeword of the inner code is not included in i consecutive bits, and j (j>i) consecutive bits do not span a plurality of symbols of the same codeword of the outer code, thereby changing the recording order.

According to another aspect of the present invention, deinterleaving is performed on data obtained by performing interleaving on a product code encoded in the order of an outer code and an inner code so that in the recording order after the interleaving is performed, the same codeword of the inner code is not included in i consecutive bits, and j (j>i) consecutive bits do not span a plurality of symbols of the same codeword of the outer code, thereby rearranging the data into the original order.

Advantageous Effects of Invention

According to an aspect of the present invention, the recording order of a product code can be changed. Also, according to an aspect of the present invention, burst errors can be scattered with respect to both codes of the product code.

According to another aspect of the present invention, a product code that has been changed in recording order can be returned to the original order. Also, according to another aspect of the present invention, burst errors can be scattered with respect to both codes of the product code.

BRIEF DESCRIPTION OF DRAWINGS

FIG. 18 is a block diagram illustrating an example of the hardware configuration of a computer.

DESCRIPTION OF EMBODIMENTS

[Example of Configuration of Recording/Reproducing Apparatus]

Figure 1:
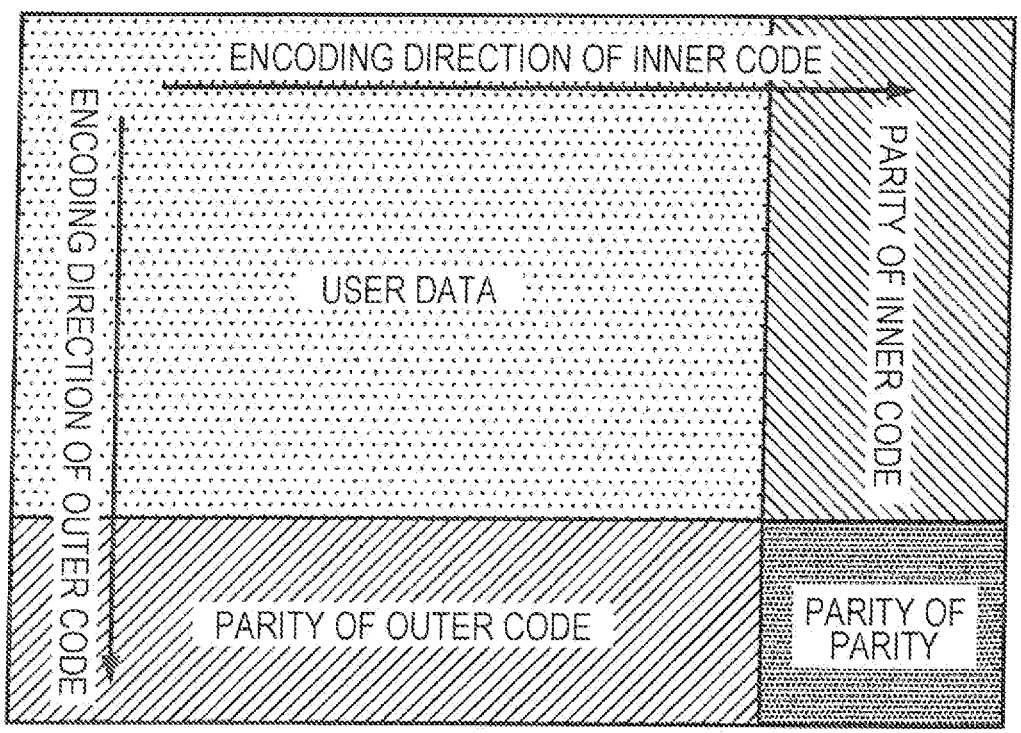
FIG. 1 is a diagram illustrating an example of the data configuration of a product code.
Figure 2:
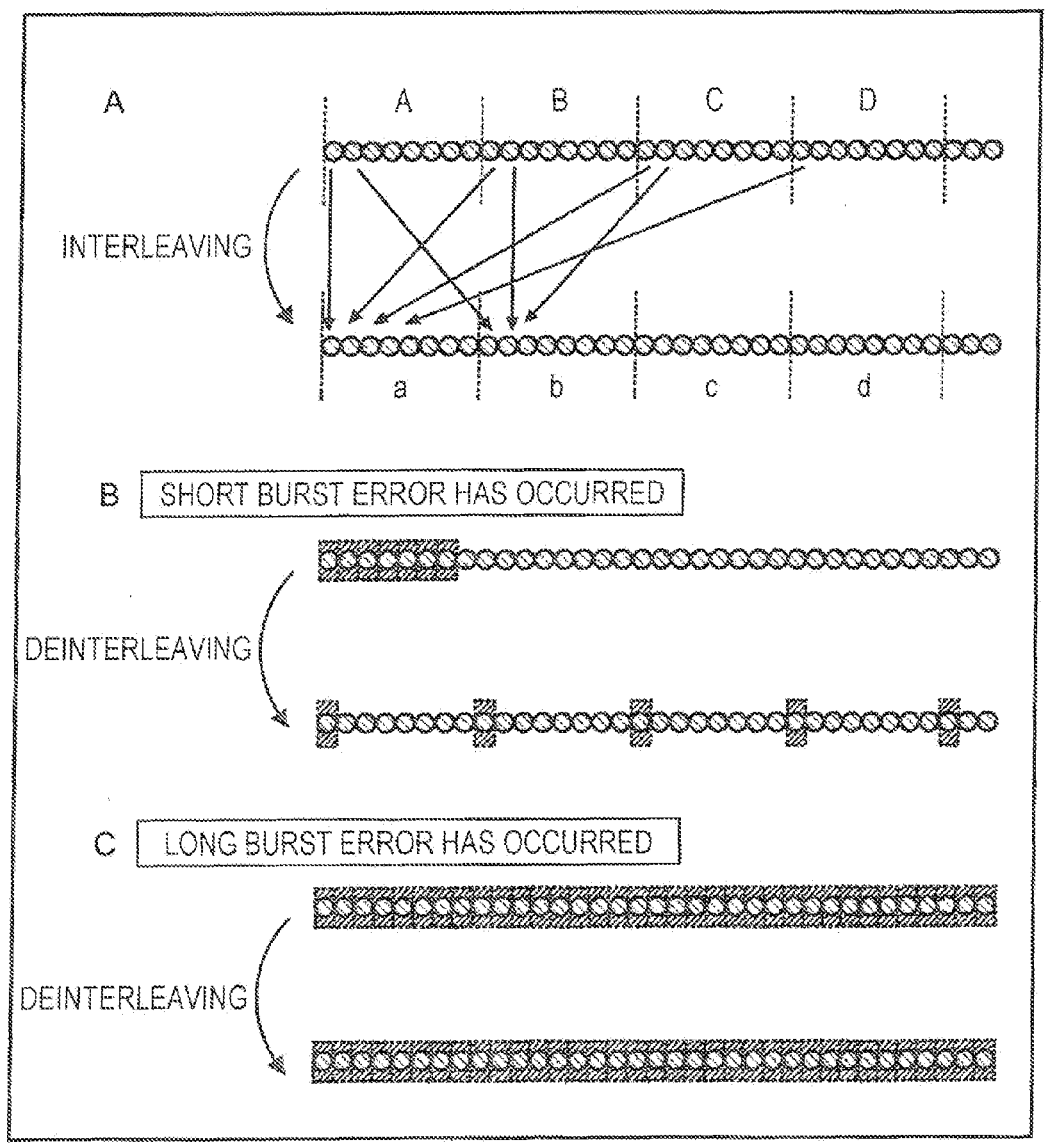
FIG. 2 is a diagram illustrating an example of interleaving and deinterleaving according to the related art.
Figure 3:
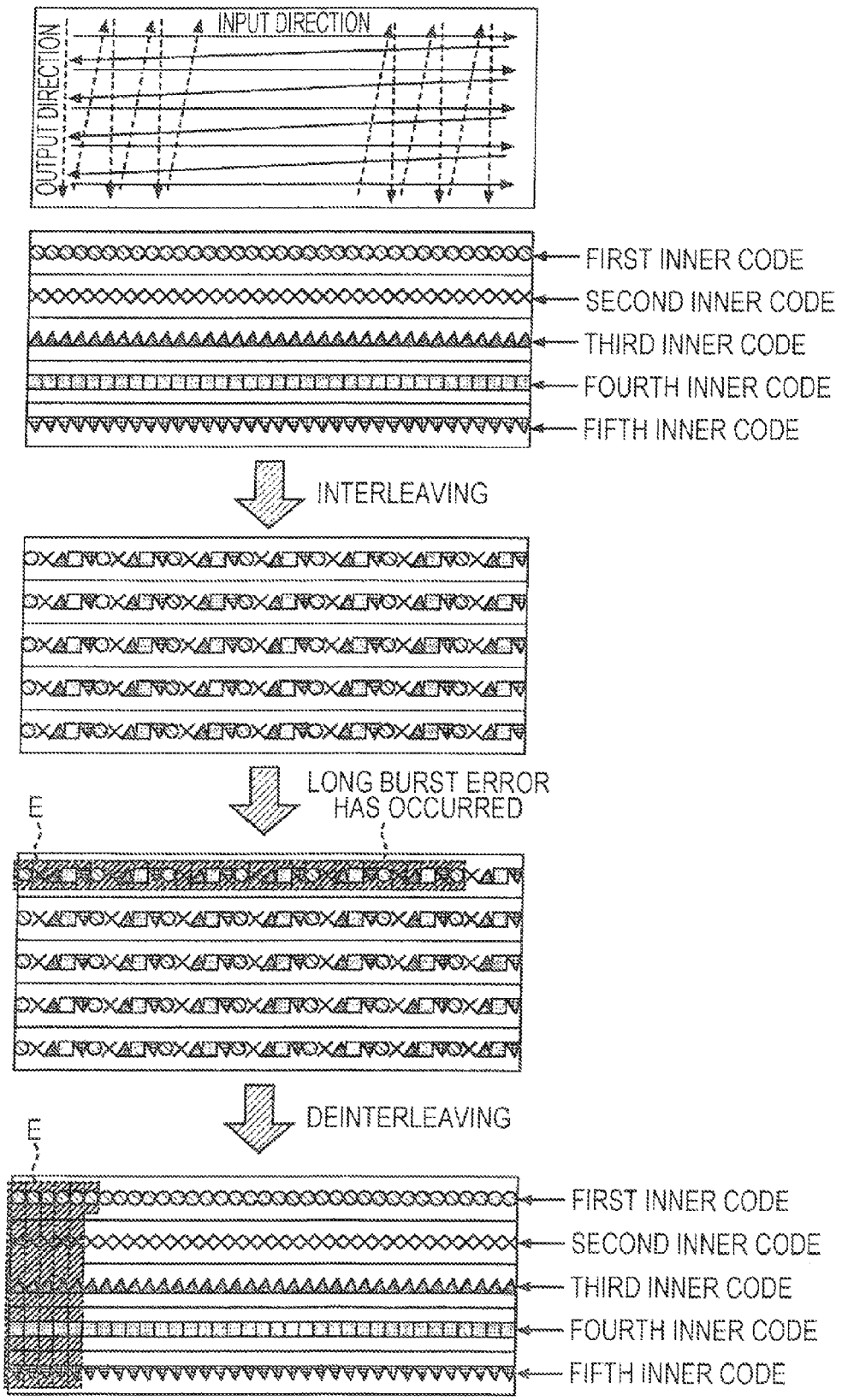
FIG. 3 is a diagram illustrating another example of interleaving and deinterleaving according to the related art.
Figure 4:
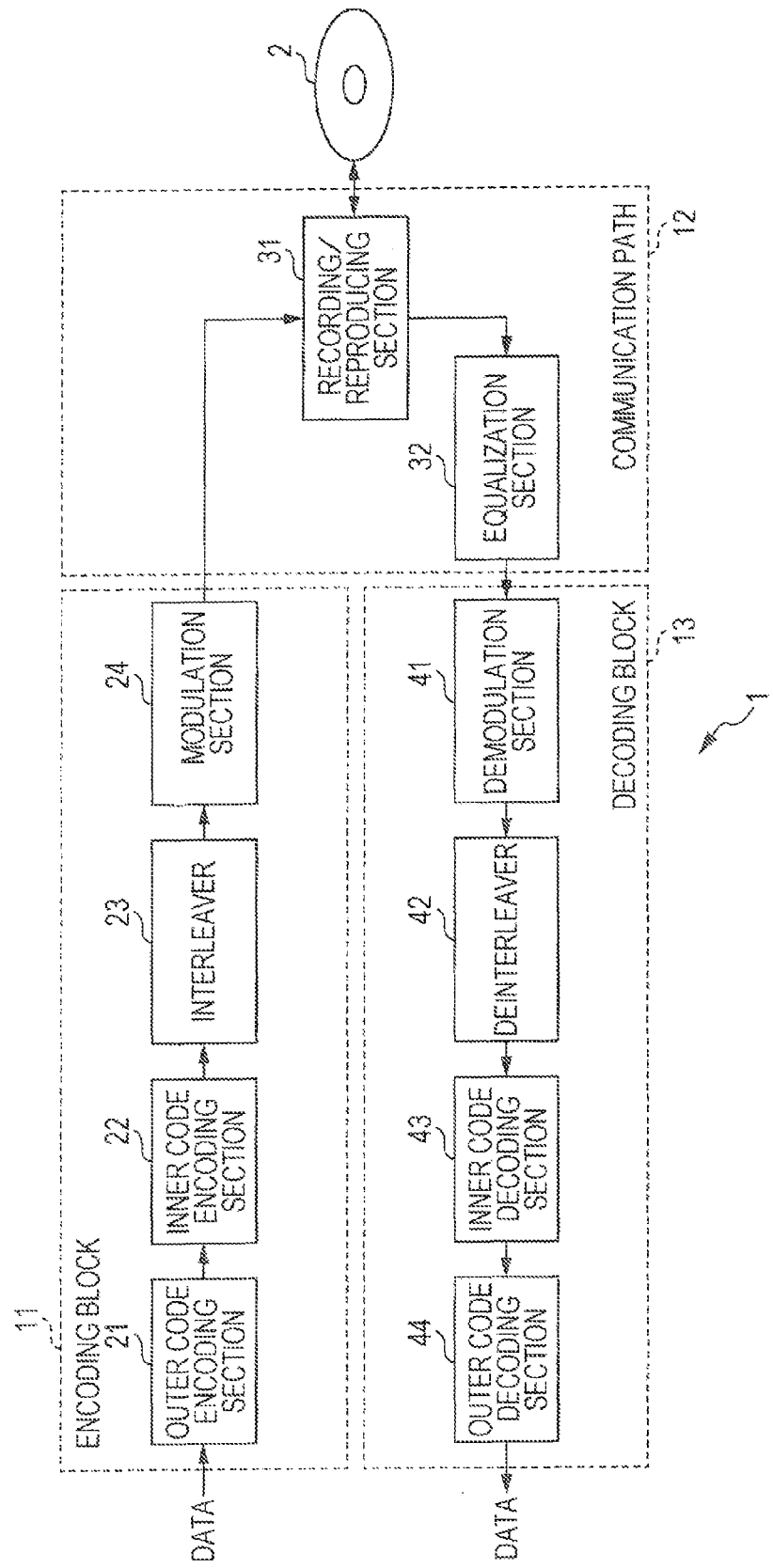
FIG. 4 is a block diagram illustrating an example of the configuration of an embodiment of a recording/reproducing apparatus to which the present invention is applied.

FIG. 4 is a block diagram illustrating an example of the configuration of an embodiment of a recording/reproducing apparatus as a data processing apparatus to which the present invention is applied. This recording/reproducing apparatus 1 performs modulation encoding on data inputted from the previous stage in advance, and records the data to a recording medium 2 that is mounted, and also reads a signal from the recording medium 2, reproduces the original signal, and outputs the data obtained as a result to the subsequent stage.

In the example in FIG. 4, the recording/reproducing apparatus 1 includes an encoding block 11, a communication path 12, and a decoding block 13. The recording medium 2 is formed by, for example, an optical disc such as a Blu-ray Disc (registered trademark of Sony Corporation) or a DVD (Digital Versatile Disc), a magneto-optical disc, or a magnetic disk.

The encoding block 11 includes an outer code encoding section 21, an inner code encoding section 22, an interleaver 23, and a modulation section 24, and performs a predetermined encoding process on data inputted from an unillustrated previous stage.

The outer code encoding section 21 performs, on the data inputted from the previous stage, encoding of an outer code by using, as the outer code, an error correcting code for performing decoding in units of symbols with n bits as one symbol, and outputs the resulting data to the inner code encoding section 22. As the outer code, for example, an RS (Reed-Solomon) code is used, which is an error correcting code for performing symbol-wise decoding. By using an RS(n, k) code (n: code length, k: information length) that encodes k symbols into n symbols, it is possible to correct errors up to the number of corrections (n−k)/2 symbols by bounded distance decoding.

The inner code encoding section 22 performs, on the data from the outer code encoding section 21, encoding of an inner code by using, as the inner code, an error correcting code for performing decoding in units of bits. As the inner code, for example, a turbo code, an LDPC (Low Density Parity Check) code, or the like is used, which is an error correcting code for performing decoding in units of bits. Use of these codes can provide a large coding gain, thus enabling high quality transmission. The inner code encoding section 22 outputs a product code, which is the code encoded by the inner code encoding section 22 after being encoded by the outer code encoding section 21, to the interleaver 23.

The interleaver 23 performs interleaving (rearrangement) on the product code from the inner code encoding section 22 to change its recording order, and outputs the interleaved data to the modulation section 24. The interleaver 23 changes the recording order in such a way that in the interleaved data, the same codeword of the inner code is not included in i consecutive bits, and j (j>i) consecutive bits do not span a plurality of symbols of the same codeword of the outer code. Also, the cycle of interleaving by the interleaver 23 is smaller than one codeword of the product code.

The modulation section 24 applies predetermined modulation to the data whose recording order has been changed by the interleaver 23, and outputs the signal obtained as a result to the communication path 12.

The communication path 12 includes a recording/reproducing section 31 and an equalization section 32, and performs, for example, a recording/reproduction process on a recording/reproduction channel of PR2 (Partial Response class-2). The recording/reproducing section 31 performs, for example, NRZI (non return to zero Inverted) encoding on the signal inputted from the encoding block 11, and records the NRZI-encoded signal to the recording medium 2 being mounted, by using, for example, the Mark Edge Recording method.

Also, the recording/reproducing section 31 reads an encoded signal recording on the recording medium 2 on the PR2 channel, and supplies the read signal to the equalization section 32. The equalization section 32 applies PR equalization using waveform interference to the supplied signal so as to achieve predetermined target equalization characteristics, and supplies the signal to the decoding block 13.

The decoding block 13 includes a demodulation section 41, a deinterleaver 42, an inner code decoding section 43, and an outer code decoding section 44, and performs a decoding process on the signal from the communication path 12.

The demodulation section 41 performs, on the signal from the communication path 12, demodulation corresponding to the modulation applied by the modulation section 24, and outputs the demodulated data to the deinterleaver 42.

The deinterleaver 42 performs, on the data from the demodulation section 41, deinterleaving in the direction opposite to the interleaving of the interleaver 23 to thereby return the recording order changed by the interleaving 23 to the original order, and outputs a product code as the deinterleaved data to the inner code decoding section 43.

The inner code decoding section 43 performs, on the product code from the deinterleaver 42, decoding of the inner code corresponding to the encoding by the inner code encoding section 22, and outputs the decoded data to the outer code decoding section 44. The outer code decoding section 44 performs, on the data from the inner code decoding section 43, decoding of the outer code corresponding to the encoding by the outer code encoding section 21, and outputs the decoded data to an unillustrated subsequent stage.

[Example of Configuration of Interleaver]

Figure 5:
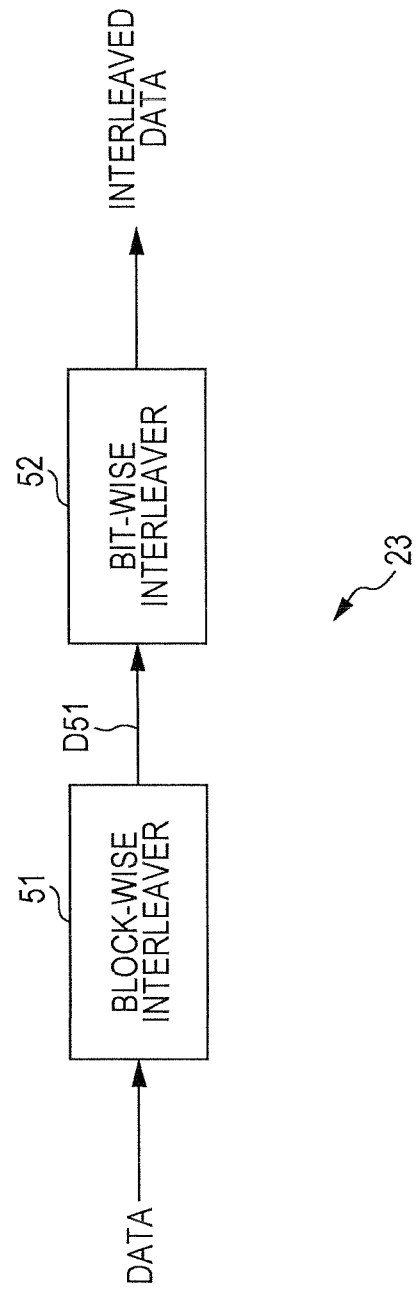
FIG. 5 is a diagram illustrating an example of the configuration of an interleaver.

FIG. 5 represents an example of the configuration of the interleaver in FIG. 4.

In the example in FIG. 5, the interleaver 23 performs interleaving in two stages. That is, the interleaver 23 includes a block-wise interleaver 51 that performs the first stage of interleaving in units of blocks, and a bit-wise interleaver 52 that performs the second stage of interleaving in units of bits.

The block-wise interleaver 51 processes data in units of NB bits. In other words, in the block-wise interleaver 51, processing is performed in units of blocks, with NB bits as one block. The block-wise interleaver 51 accumulates bits equivalent to NA pieces of the inner code, that is, NA×NB×NC bits, in a built-in RAM. It should be noted that NC represents the number of bits of one piece of the inner code/NB bits, that is, the number of blocks in one piece of the inner code.

The first stage of interleaving by the block-wise interleaver 51 includes interleaving A in units of ND×n×NA bits, and interleaving B of the remainder in units of ((NA×NB×NC)−(NA×n×ND)) bits.

Here, n is the number of bits representing one symbol of the outer code, and is equal to the number of bits NB of one block of the block-wise interleaver 51. Also, NA and ND are disjoint, and ND×n, that is, ND×NB needs to be equal to or more than the information length of the inner code.

The block-wise interleaver 51 first performs interleaving A on ND×NB×NA bits, performs interleaving B on (NC−ND)×NB×NA bits, and passes data D51 obtained after the interleaving to the bit-wise interleaver 52. That is, the block-wise interleaver 51 first passes the blocks on which interleaving A has been performed, and then passes the blocks on which interleaving B has been performed, to the bit-wise interleaver 52.

The bit-wise interleaver 52 performs the second stage of interleaving of NA×NB bits NC times in units of bits, by using the built-in RAM. The data on which interleaving has been performed by the bit-wise interleaver 52 is outputted to the modulation section 24.

[Recording Process in Recording/Reproducing Apparatus]

Figure 6:
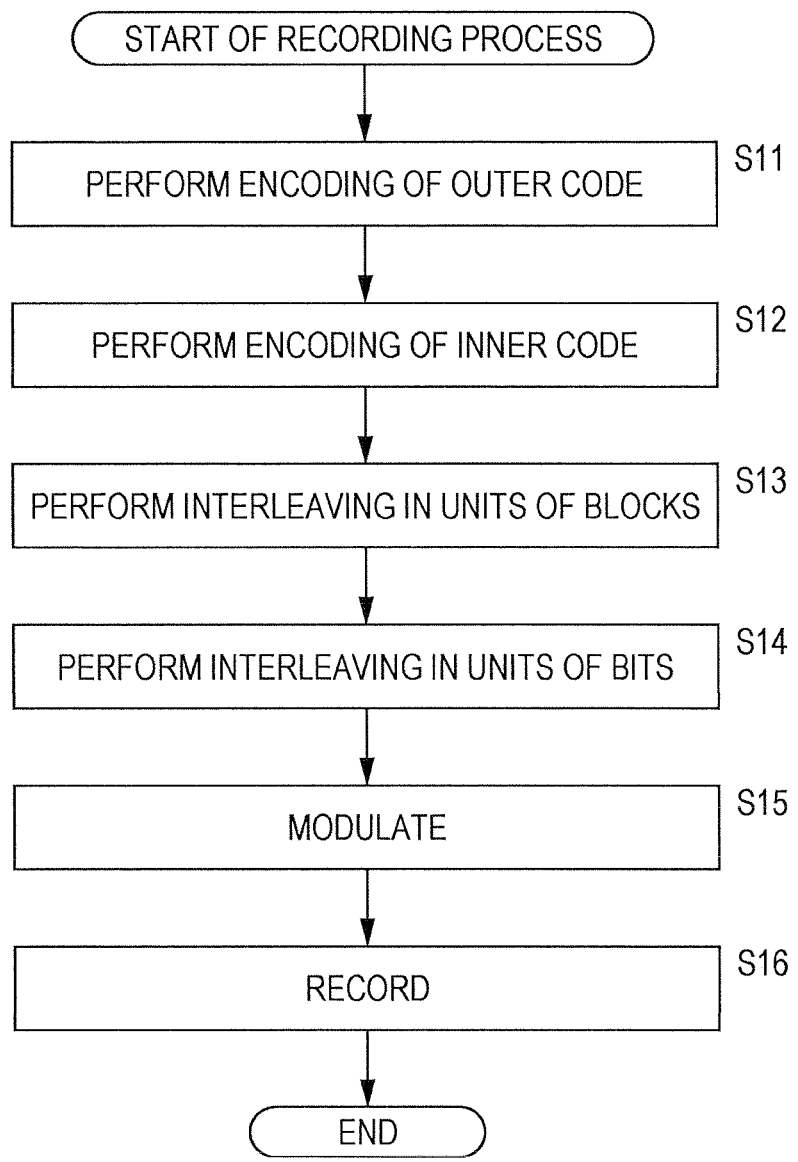
FIG. 6 is a flowchart for explaining a recording process in the recording/reproducing apparatus in FIG. 4.

Next, referring to the flowchart in FIG. 6, a recording process in the recording/reproducing apparatus 1 will be described.

Data is inputted to the outer code encoding section 21 from an unillustrated previous stage. In step S11, the outer code encoding section 21 performs, on the inputted data, encoding of an outer code by using, as the outer code, an error correcting code for performing decoding in units of symbols with n bits as one symbol.

The data on which encoding of the outer code has been performed is outputted to the inner code encoding section 22.

In step S12, the inner code encoding section 22 performs, on the data from the outer code encoding section 21, encoding of an inner code by using, as the inner code, an error correcting code for performing decoding in units of bits. The inner code encoding section 22 outputs a product code, which is the code encoded by the inner code encoding section 22 after being encoded by the outer code encoding section 21, to the interleaver 23.

In step S13, the block-wise interleaver 51 performs the first stage of interleaving in units of blocks, on the product code from the inner code encoding section 22. Details of this interleaving process by the block-wise interleaver 51 will be described later with reference to FIG. 7.

The data D51 obtained after the interleaving by the block-wise interleaver 51 is outputted to the bit-wise interleaver 52.

In step S14, the bit-wise interleaver 52 further performs the second stage of interleaving in units of bits, on the data on which interleaving has been performed by the block-wise interleaver 51. Details of this interleaving process by the bit-wise interleaver 52 will be described later with reference to FIG. 9.

The data obtained after interleaving is performed in the order of steps S13 and S14 has been rearranged in such a recording order that the same codeword of the inner code is not included in i consecutive bits, and j (j>i) consecutive bits do not span a plurality of symbols of the same codeword of the outer code. The data on which interleaving has been performed by the bit-wise interleaver 52 is outputted to the modulation section 24.

In step S15, the modulation section 24 applies predetermined modulation to the data whose recording order has been changed by the block-wise interleaver 51 and the bit-wise interleaver 52, and outputs the signal obtained as a result to the recording/reproducing section 31.

In step S16, the recording/reproducing section 31 performs NRZI encoding on the signal inputted from the modulation section 24, and records the NRZI-encoded signal to the recording medium 2 being mounted.

In the above-described manner, data is recorded to the recording medium 2 in such a recording order that the same codeword of the inner code is not included in i consecutive bits, and j (j>i) consecutive bits do not span a plurality of symbols of the same codeword of the outer code.

[Details of Block-Wise Interleaver]

Figure 7:
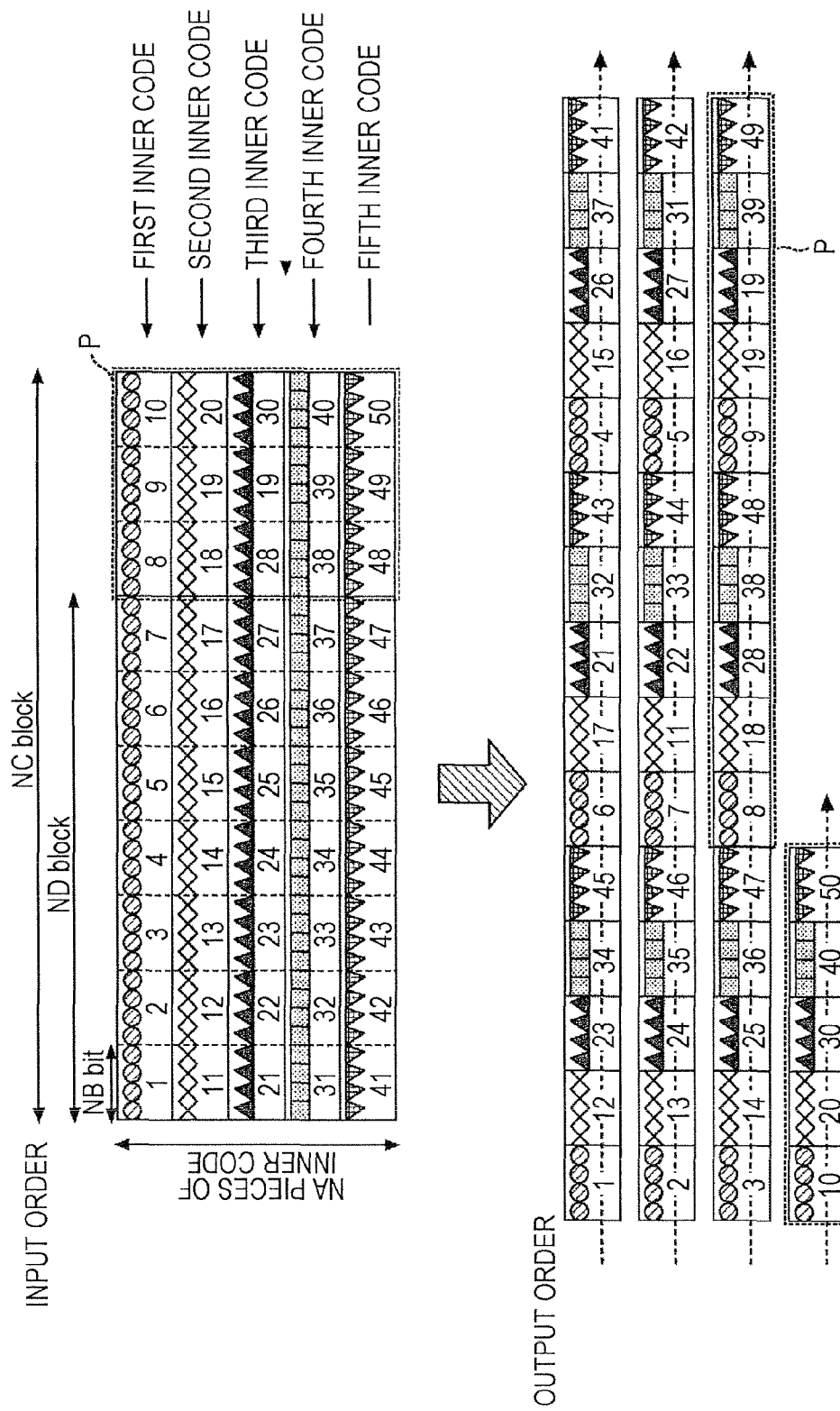
FIG. 7 is a diagram for explaining an example of processing of a block-wise interleaver.

FIG. 7 is a diagram illustrating an example of the first stage of interleaving by the block-wise interleaver 51. In the example in FIG. 7, a product code with the order of input to the RAM attached, and its output order in the case of NA=5, NB=n=4, NC=10, and ND=7 is illustrated.

In the case of the example in FIG. 7, the product code includes NC=10 blocks of the outer code in the column direction (direction from left to right in the drawing), and includes NA=5 pieces of the inner code in the row direction (direction from top to bottom in the drawing). The circle marks illustrated in the first inner code represent bits of the first inner code, and the × marks illustrated in the second inner code represent bits of the second inner code. Likewise, the upward-pointing triangle marks illustrated in the third inner code represent bits of the third inner code, the square marks illustrated in the fourth inner code represent bits of the fourth inner code, and the downward-pointing triangle marks illustrated in the fifth inner code represent bits of the fifth inner code.

That is, the code length of one piece of the inner code is 40 bits, which is made up of NC=10 blocks with NB=4 bits as one block in each piece of the inner code. The numbers indicated in the blocks represent the order of input to the RAM. Also, ND=7 blocks out of the NC=10 blocks of the outer code which constitute each piece of the inner code is a user data portion, and NC−ND (=3) blocks indicated by P is the parity portion of the inner code.

The block-wise interleaver 51 performs interleaving A on ND×NB×NA (=7×4×5) bits, which represent the user data portion of the product code in FIG. 7.

In interleaving A, as indicated by the input order, data is inputted NB bits by NB bits (=block by block) in the order of the column direction as one direction. That is, blocks that are assigned numbers 1 to 50 are inputted in ascending order of the numbers. Then, for example, data in the RAM is read in the order of the direction diagonally downward to the right, in such a way that following the first block in input order, the twelfth block is read. It should be noted that the direction in which data is read may be any diagonal direction, and is not limited to the direction diagonally downward to the right.

More specifically, let the index of blocks generated by dividing the inner code in units of NB bits be x=0, 1, . . . , ND−1 in serial order, let the index of the inner code be y=0, 1, . . . , NA−1 in serial order, and let the x-th block of the y-th inner code be (x, y). For example, the first block in input order is represented by (0, 0). In this case, the reading order due to interleaving A is in the order of blocks (x, y) represented by Equation (1).

$$x = (k \bmod ND)$$

$$y = (k \bmod NA)$$

$$k = 0, 1, 2, \ldots, N-1 \qquad (1)$$

Here, A mod B represents the remainder when A is divided by B, and k is a variable that counts the number of blocks to be read, and N is the number of blocks NA×ND read.

By this interleaving A, from the block-wise interleaver 51, blocks within the range of ND×NB×NA bits which is the user data portion are outputted in the following serial order, as indicated by their output order.

First, the first block (0, 0) in input order of the first inner code is outputted first, the twelfth block (1, 1) in input order of the second inner code is outputted second, and the twenty-third block (2, 2) in input order of the third inner code is outputted third. The thirty-fourth block (3, 3) in input order of the fourth inner code is outputted fourth, and the forty-fifth block (4, 4) in input order of the fifth inner code is outputted fifth.

Thereafter, the sixth block (5, 0) in input order of the first inner code is outputted sixth, the seventeenth block (6, 1) in input order of the second inner code is outputted seventh, and the twenty-first block (0, 2) in input order of the third inner code is outputted eighth. The thirty-second block (1, 3) in input order of the fourth inner code is outputted ninth, and the forty-third block (2, 4) in input order of the fifth inner code is outputted tenth. Next, the fourth block (3, 0) in input order of the first inner code is outputted eleventh, the fifteenth block (4, 1) in input order of the second inner code is outputted twelfth, and the twenty-sixth block (5, 2) in input order of the third inner code is outputted thirteenth. The thirty-seventh block (6, 3) in input order of the fourth inner code is outputted fourteenth, and the forty-first block (0, 4) in input order of the fifth inner code is outputted fifteenth.

Further, the second block (1, 0) in input order of the first inner code is outputted sixteenth, the thirteenth block (2, 1) in input order of the second inner code is outputted seventeenth, and the twenty-fourth block (3, 2) in input order of the third inner code is outputted eighteenth. The thirty-fifth block (4, 3) in input order of the fourth inner code is outputted nineteenth, and the forty-sixth block (5, 4) in input order of the fifth inner code is outputted twentieth. Next, the seventh block (6, 0) in input order of the first inner code is outputted twenty-first, the eleventh block (0, 1) in input order of the second inner code is outputted twenty-second, and the twenty-second block (1, 2) in input order of the third inner code is outputted twenty-third. The thirty-third block (2, 3) in input order of the fourth inner code is outputted twenty-fourth, and the forty-fourth block (3, 4) in input order of the fifth inner code is outputted twenty-fifth.

Thereafter, the fifth block (4, 0) in input order of the first inner code is outputted twenty-sixth, the sixteenth block (5, 1) in input order of the second inner code is outputted twenty-seventh, and the twenty-seventh block (6, 2) in input order of the third inner code is outputted twenty-eighth. The thirty-first block (0, 3) in input order of the fourth inner code is outputted twenty-ninth, and the forty-second block (1, 4) in input order of the fifth inner code is outputted thirtieth. Next, the third block (2, 0) in input order of the first inner code is outputted thirty-first, the fourteenth block (3, 1) in input order of the second inner code is outputted thirty-second, and the twenty-fifth block (4, 2) in input order of the third inner code is outputted thirty-third. The thirty-sixth block (5, 3) in input order of the fourth inner code is outputted thirty-fourth, and the forty-seventh block (6, 4) in input order of the fifth inner code is outputted thirty-fifth.

By reading data in the above order, in the data that has been read, the data sequence is permuted in such a way that a block belonging to the same codeword of the inner code does not appear twice in i=NA=5 consecutive blocks when viewed in output order. At the same time, the data sequence is permuted in such a way that different symbols of the same codeword of the outer code do not appear in NA×NE consecutive blocks. Here, NE is the largest integer that satisfies NA×NE≦ND. That is, in the case of the example in FIG. 6, NE=1, and the data sequence is permuted in such a way that different symbols of the same codeword of the outer code do not appear in NA×NE=5 consecutive blocks.

In this way, in the region subject to interleaving A, even when a short burst error has occurred, the short burst error can be changed into a random error with respect to both the outer code and the inner code. On the other hand, even when a long burst error has occurred, the error can be scattered to some extent with respect to the inner code, and at the same time, the error can be treated as a burst error with respect to the outer code. Details of the effect of this will be described later with reference to FIGS. 12 to 17.

Incidentally, suppose a range generated by repeating ND blocks a plurality of times (for example, NA times), and repeating NA pieces of the inner code a plurality of times (for example, ND times). It can be also said that in this range, interleaving A is realized by outputting NA×ND blocks in order in such a way that the block located diagonally below the block to be outputted becomes the next block to be outputted.

Next, the block-wise interleaver 51 performs interleaving B on the portion of the product code in FIG. 7 excluding the user data portion, that is, (NC−ND)×NB×NA (=2×4×5) bits, which is the parity portion of the inner code indicated by P.

In interleaving B, data is inputted NB bits by NB bits (=block by block) to the RAM in the order of the column direction (horizontal direction in the drawing) as one direction, and the inputted data in the RAM is read in the order of the row direction (vertical direction in the drawing) as the other direction.

By this interleaving B, from the block-wise interleaver 51, after the blocks in the user data portion, blocks within the range of (NC−ND)×NB×NA bits which is the parity portion of the inner code are outputted in the following serial order, as indicated by their output order.

First, the eighth block in input order of the first inner code is outputted thirty-sixth, the eighteenth block in input order of the second inner code is outputted thirty-seventh, and the twenty-eighth block in input order of the third inner code is outputted thirty-eighth. The thirty-eighth block in input order of the fourth inner code is outputted thirty-ninth, and the forty-eighth block in input order of the fifth inner code is outputted fortieth.

Also, the ninth block in input order of the first inner code is outputted forty-first, the nineteenth block in input order of the second inner code is outputted forty-second, and the twenty-ninth block in input order of the third inner code is outputted forty-third. The thirty-ninth block in input order of the fourth inner code is outputted forty-fourth, and the forty-fifth block in input order of the fifth inner code is outputted forty-fifth. Next, the tenth block in input order of the first inner code is outputted forty-sixth, the twentieth block in input order of the second inner code is outputted forty-seventh, and the thirtieth block in input order of the third inner code is outputted forty-eighth. The fortieth block in input order of the fourth inner code is outputted forty-ninth, and the fiftieth block in input order of the fifth inner code is outputted fiftieth.

By reading data in the above order, in the data that has been read, the data sequence is permuted in such a way that a block belonging to the same codeword of the inner code does not appear twice in NA=5 consecutive blocks when viewed in output order.

In this way, in the region subject to interleaving B, even when a short burst error has occurred, the short burst error can be changed into a random error with respect to both the outer code and the inner code.

It should be noted that unlike the region subject to interleaving A, this region subject to interleaving B is a non-codeword portion when viewed from the outer code, and thus it suffices for a short burst error to become a random error at the time of decoding of the inner code.

Also, let the index of blocks generated by dividing the inner code in units of NB bits be x=0, 1, . . . , NC−1 in serial order, let the index of the inner code be y=0, 1, . . . , NA−1 in serial order, and let the x-th block of the y-th inner code be (x, y).

In this case, it can be also said that the block-wise interleaver 51 realizes interleaving B by performing conversion with respect to a range of (NC−ND)×NB×NA bits in such a way that, for signals prior to interleaving:

(ND, 0), (ND+1, 0), . . . , (NC−1, 0), (ND, 1), (ND+1, 1), . . . , (NC−1, 1), (ND, NA−1), (1, NA−1), . . . , (NC−1, NA−1), the signals after interleaving become:

(ND, 0), (ND, 1), . . . , (ND, NA−1), (ND+1, 0), (ND+1, 1), . . . , (ND+1, NA−1), (NC−1, 0), (NC−1, 1), . . . , (NC−1, NA−1).

In further other words, it can be said that interleaving B is realized by outputting the (ND+1)-th block in each piece of the inner code in order, outputting the (ND+2)-th block in each piece of the inner code in order, and thereafter, likewise, outputting the NC-th block in each piece of the inner code in order, with respect to the range of (NC−ND)×NB×NA bits.

[Another Description of Block-Wise Interleaver]

Figure 8:
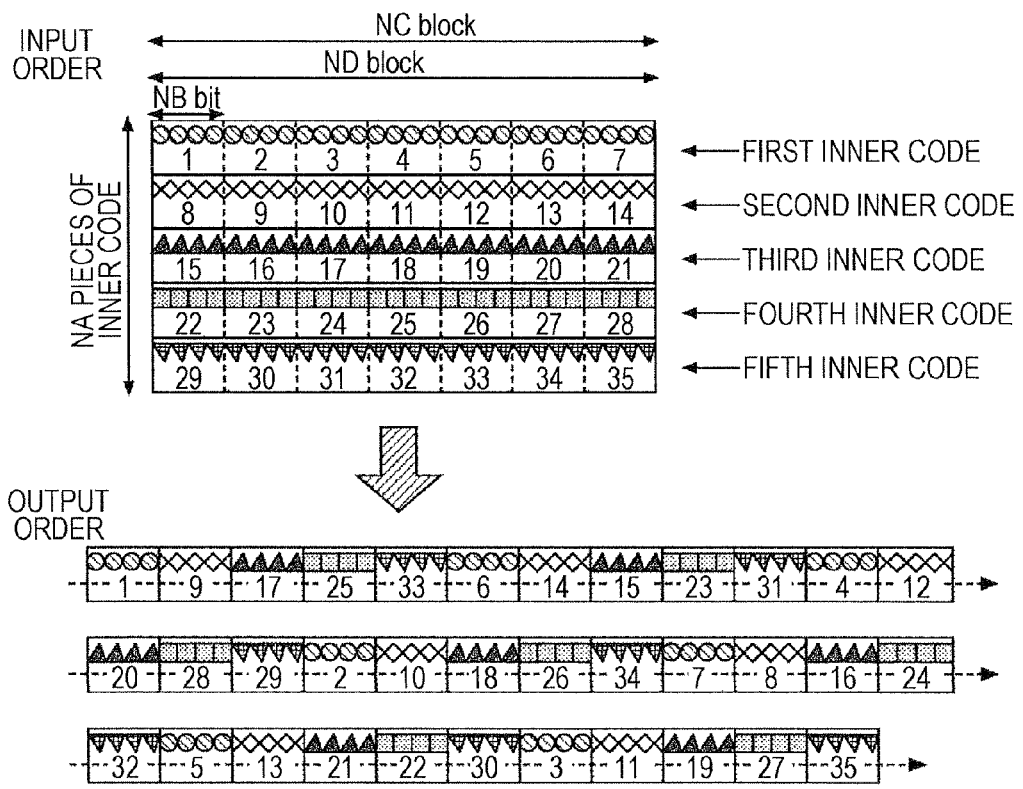
FIG. 8 is a diagram for explaining another example of processing of a block-wise interleaver.

FIG. 8 is a diagram illustrating another example of the first stage of interleaving by the block-wise interleaver 51. In the example in FIG. 8, a product code with the order of input to the RAM attached, and its output order in the case of NA=5, NB=n=4, NC=7, and ND=7 is illustrated.

In the example in FIG. 8, the only difference from the example in FIG. 7 is that there is no portion to be processed by interleaving B, and otherwise the basic process of interleaving A is the same as that in the case of the example in FIG. 7. That is, in the example in FIG. 8, the same interleaving A as that in the user data portion is also performed with respect to an unillustrated parity portion of the inner code. It should be noted that in the case of the example in FIG. 8, the conditions that ND=NC, and that NA and NC be disjoint are required.

That is, in the case of the example in FIG. 8, the block-wise interleaver 51 inputs data NB bits by NB bits (=block by block) in the order of the column direction, with respect to NC×NB×NA (=7×4×5) bits. Then, the block-wise interleaver 51 reads data in the RAM in the order of the direction diagonally downward to the right, in the same serial order as that in the case of the ND×NB×NA bits in FIG. 7, in such a way that following the first block in input order, the ninth block is read.

By this interleaving, from the block-wise interleaver 51, blocks within the range of NC×NB×NA bits are outputted in the following serial order, as indicated by their output order.

First, the first block (0, 0) in input order of the first inner code is outputted first, the ninth block (1, 1) in input order of the second inner code is outputted second, and the seventeenth block (2, 2) in input order of the third inner code is outputted third. The twenty-fifth block (3, 3) in input order of the fourth inner code is outputted fourth, and the thirty-third block (4, 4) in input order of the fifth inner code is outputted fifth.

Also, the sixth block (5, 0) in input order of the first inner code is outputted sixth, the fourteenth block (6, 1) in input order of the second inner code is outputted seventh, and the fifteenth block (0, 2) in input order of the third inner code is outputted eighth. The twenty-third block (1, 3) in input order of the fourth inner code is outputted ninth, and the thirty-first block (2, 4) in input order of the fifth inner code is outputted tenth. Next, the fourth block (3, 0) in input order of the first inner code is outputted eleventh, the twelfth block (4, 1) in input order of the second inner code is outputted twelfth, and the twentieth block (5, 2) in input order of the third inner code is outputted thirteenth. The twenty-eighth block (6, 3) in input order of the fourth inner code is outputted fourteenth, and the twenty-ninth block (0, 4) in input order of the fifth inner code is outputted fifteenth.

Further, the second block (1, 0) in input order of the first inner code is outputted sixteenth, the tenth block (2, 1) in input order of the second inner code is outputted seventeenth, and the eighteenth block (3, 2) in input order of the third inner code is outputted eighteenth. The twenty-sixth block (4, 3) in input order of the fourth inner code is outputted nineteenth, and the thirty-fourth block (5, 4) in input order of the fifth inner code is outputted twentieth. Next, the seventh block (6, 0) in input order of the first inner code is outputted twenty-first, the eighth block (0, 1) in input order of the second inner code is outputted twenty-second, and the sixteenth block (1, 2) in input order of the third inner code is outputted twenty-third. The twenty-fourth block (2, 3) in input order of the fourth inner code is outputted twenty-fourth, and the thirty-second block (3, 4) in input order of the fifth inner code is outputted twenty-fifth.

Also, the fifth block (4, 0) in input order of the first inner code is outputted twenty-sixth, the sixteenth block (5, 1) in input order of the second inner code is outputted twenty-seventh, and the twenty-first block (6, 2) in input order of the third inner code is outputted twenty-eighth. The twenty-second block (0, 3) in input order of the fourth inner code is outputted twenty-ninth, and the thirtieth block (1, 4) in input order of the fifth inner code is outputted thirtieth. Next, the third block (2, 0) in input order of the first inner code is outputted thirty-first, the eleventh block (3, 1) in input order of the second inner code is outputted thirty-second, and the nineteenth block (4, 2) in input order of the third inner code is outputted thirty-third. The twenty-seventh block (5, 3) in input order of the fourth inner code is outputted thirty-fourth, and the thirty-fifth block (6, 4) in input order of the fifth inner code is outputted thirty-fifth.

As described above, the first stage of interleaving by the block-wise interleaver 51 can be also configured solely by interleaving A.

[Details of Bit-Wise Interleaver]

Figure 9:
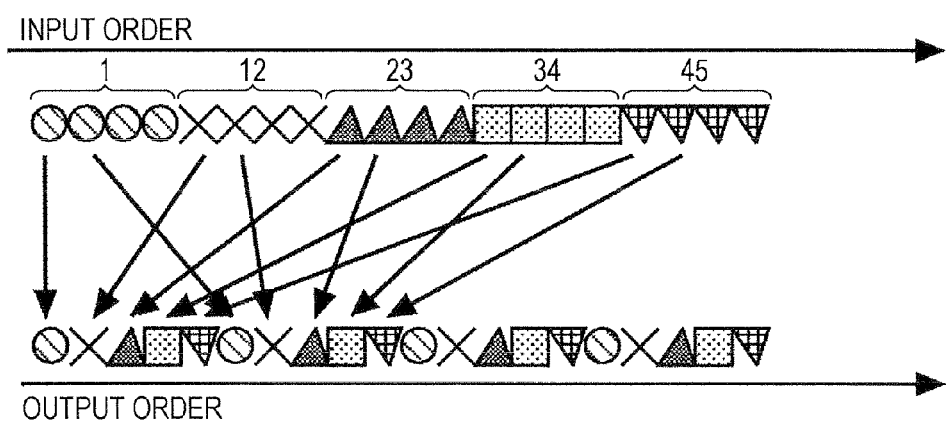
FIG. 9 is a diagram for explaining an example of processing of a bit-wise interleaver.

FIG. 9 is a diagram illustrating an example of the second stage of interleaving by the bit-wise interleaver 52. In the example in FIG. 9, the order of input to the RAM, and the output order in the case of NA=5 and NB=4 are illustrated.

The bit-wise interleaver 52 performs bit-wise interleaving that permutes bits, NC times for every NA blocks as a group of NA blocks (NB bits) whose order has been changed by the block-wise interleaver 51.

That is, the bit-wise interleaver 52 performs interleaving for every 5 blocks each made up of 4 bits. To explain this using the numbers attached to the blocks in FIG. 7 (numbers indicating the order of input to the block-wise interleaver 51), the bit-wise interleaver 52 inputs the bits (circle marks) of the first block in order, and inputs the bits (x marks) of the twelfth block in order. Next, the bit-wise interleaver 52 inputs the bits (upward-pointing triangle marks) of the twenty-third block in order, inputs the bits (square marks) of the thirty-fourth block in order, and inputs the bits (downward-pointing triangle marks) of the forty-fifth block in order.

Then, the bit-wise interleaver 52 outputs the first bit of each of the blocks in order, and outputs the second bit of each of the blocks in order. Next, the bit-wise interleaver 52 outputs the third bit of each of the blocks in order, outputs the fourth bit of each of the blocks in order, and outputs the fifth bit of each of the blocks in order, thereby performing interleaving.

That is, as indicated by the output order in FIG. 9, first, the first bit of the first block, the first bit of the twelfth block, the first bit of the twenty-third block, the first bit of the thirty-fourth block, and the first bit of the forty-fifth block are outputted in order. Next, the second bit of the first block, the second bit of the twelfth block, the second bit of the twenty-third block, the second bit of the thirty-fourth block, and the second bit of the forty-fifth block are outputted in order. Subsequently, likewise, the third to fourth bits of each of the blocks are outputted in order.

Thereafter, such a process is repeated NC−1 times for blocks other than the blocks mentioned above, and the interleaving by the bit-wise interleaver 52 is finished.

As described above, in the recording/reproducing apparatus 1, the interleaving by the block-wise interleaver 51 mentioned above with reference to FIG. 7, and the interleaving by the interleaving bit-wise interleaver 52 mentioned above with reference to FIG. 9 are performed.

Thus, the product data encoded in the order of the outer code and the inner code can be rearranged into data in such an order that the same codeword of the inner code is not included in i (=NA) consecutive bits, and j (j=NA×NB×NE>i) consecutive bits do not span a plurality of symbols of the same codeword of the outer code.

[Example of Configuration of Deinterleaver]

Figure 10:
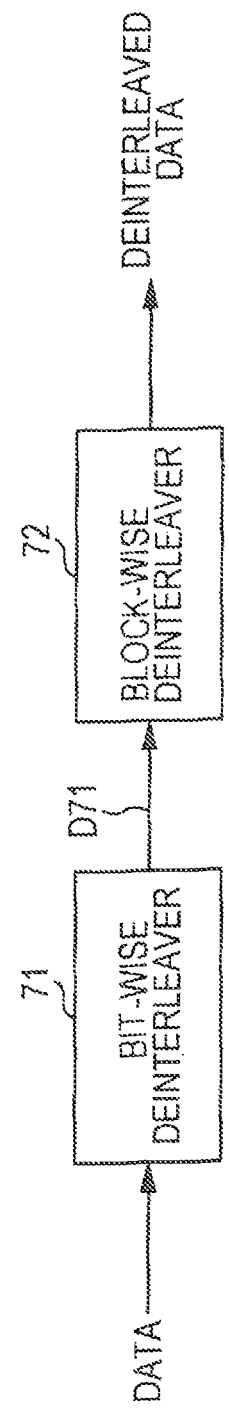
FIG. 10 is a block diagram illustrating an example of the configuration of a deinterleaver.

FIG. 10 represents an example of the configuration of the deinterleaver in FIG. 4.

In the example in FIG. 10, the deinterleaver 42 performs deinterleaving in two stages configured in the manner reverse to the interleaver 23 in FIG. 5. That is, the deinterleaver 42 includes a bit-wise deinterleaver 71 that performs the first stage of deinterleaving in units of bits, and a block-wise deinterleaver 72 that performs the second stage of deinterleaving in units of blocks. It should be noted that the first stage of deinterleaving by the bit-wise deinterleaver 71 corresponds to the second stage of interleaving. Also, the second stage of deinterleaving by the block-wise deinterleaver 72 corresponds to the first stage of interleaving.

The bit-wise deinterleaver 71 performs deinterleaving of NA×NB bits NC times in the direction opposite to the second stage of interleaving mentioned above with reference to FIG.

9. That is, by referring to FIG. 9 again to explain, bits are inputted in the output order in FIG. 9 to the RAM of the bit-wise interleaver 71. Then, from the RAM, the first bit of each of the NB (=4) blocks each made up of NA (=5) bits is outputted in order, and the second bit of each of the blocks is outputted in order. Next, the third bit of each of the blocks, the fourth bit of each of the blocks, and the fifth bit of each of the blocks are outputted in order.

As a result, as indicated by the input order in FIG. 9, the arrangement order of data is changed to the order of the first, twelfth, twenty-third, thirty-fourth, and then forty-fifth blocks each made up of 4 bits, and data D71 whose arrangement order has been changed is passed to the block-wise deinterleaver 72.

Thereafter, such a process is repeated NC−1 times for blocks other than the blocks mentioned above, and the deinterleaving by the bit-wise deinterleaver 71 is finished.

The block-wise deinterleaver 72 performs block-wise deinterleaving with NB bits as one block. In a manner corresponding to the first stage of interleaving mentioned above with reference to FIG. 7, the deinterleaving by the block-wise deinterleaver 72 also includes deinterleaving A in units of ND×NB×NA bits, and deinterleaving B of the remainder in units of (NC−ND)×NB×NA bits.

The block-wise deinterleaver 72 first performs deinterleaving A, performs deinterleaving B, and passes a product code as the deinterleaved data to the inner code decoding section 43. That is, the block-wise deinterleaver 72 first passes the blocks on which deinterleaving A has been performed, and then passes the blocks on which deinterleaving B has been performed, to the inner code decoding section 43.

In deinterleaving A, rearrangement in the direction opposite to interleaving A mentioned above with reference to FIG. 7 is performed. That is, in deinterleaving A, data is inputted in the order of the direction diagonally downward to the right, which is the output order in interleaving A. More specifically, data is inputted in the order of blocks (x, y) represented by Equation (1). Then, data in the RAM is outputted in the order of the column direction, which is the input order in interleaving A.

In deinterleaving B, rearrangement in the direction opposite to interleaving B mentioned above with reference to FIG. 7 is performed. That is, in deinterleaving B, data is inputted in the order of the row direction, which is the output order in interleaving B, and the inputted data in the RAM is read in the order of the column direction, which is the input order in interleaving B.

It should be noted that in the case where the block-wise interleaver 51 performs only interleaving A mentioned above with reference to FIG. 8, in the corresponding manner, only deinterleaving A is performed in the block-wise deinterleaver 72 as well.

[Reproduction Process in Recording/reproducing Apparatus]

Figure 11:
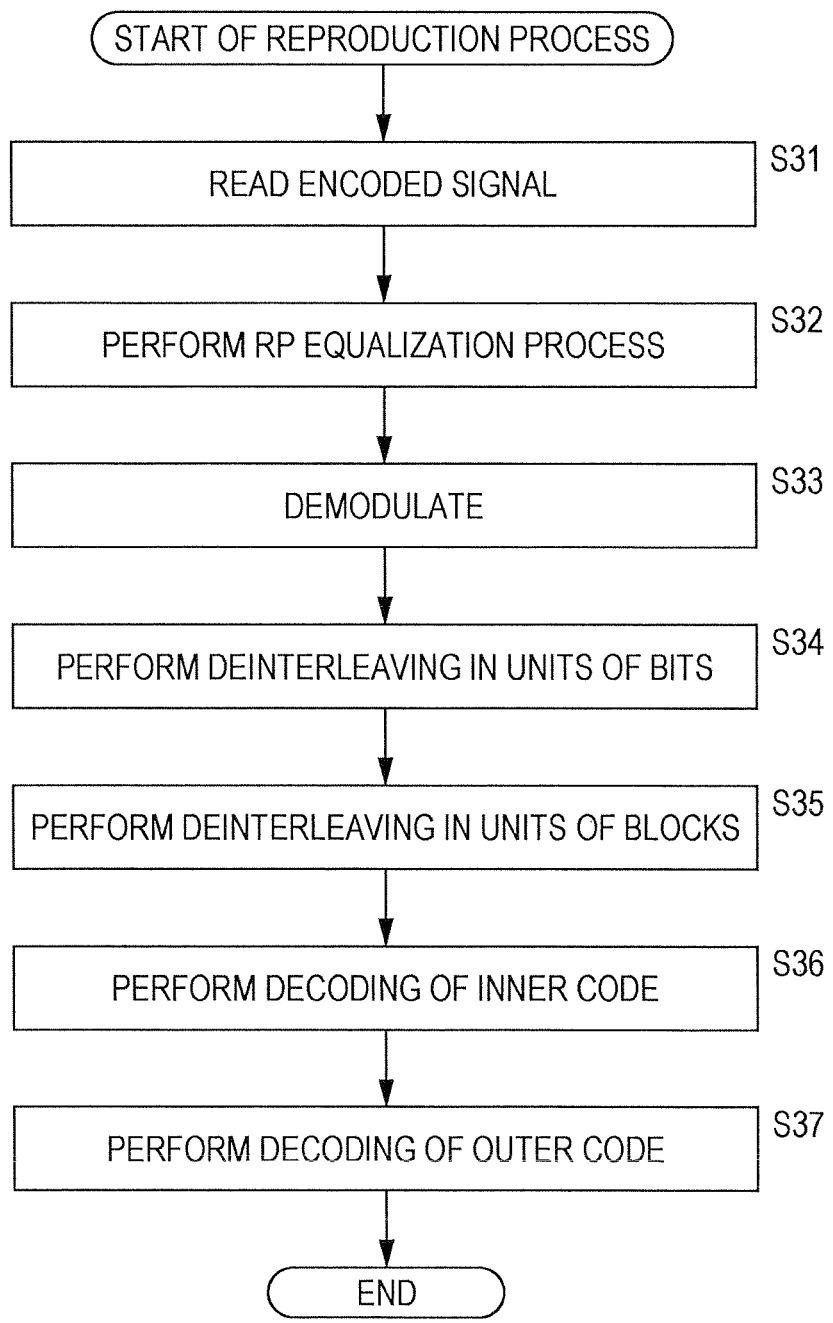
FIG. 11 is a flowchart for explaining a reproduction process in the recording/reproducing apparatus in FIG. 4.

Next, referring to the flowchart in FIG. 11, a reproduction process in the recording/reproducing apparatus 1 will be described. On the recording medium 2, encoded signals are recorded in a recording order that has been changed in such a way that the same codeword of the inner code is not included in i consecutive bits, and j (j>i) consecutive bits do not span a plurality of symbols of the same codeword of the outer code.

In step S31, the recording/reproducing section 31 reads an encoded signal recorded on the recording medium 2 on the PR2 channel, and supplies the read signal to the equalization section 32. In step S32, the equalization section 32 applies PR equalization using waveform interference to the supplied signal so as to achieve predetermined target equalization characteristics, and supplies the signal to the decoding block 13.

In step S33, the demodulation section 41 performs, on the signal from the equalization section 32, demodulation corresponding to the modulation applied by the modulation section 24, and outputs the demodulated data to the bit-wise deinterleaver 71.

In step S34, the bit-wise deinterleaver 71 performs the first stage of deinterleaving in units of bits, which corresponds to the second stage of interleaving. That is, the bit-wise deinterleaver 71 performs deinterleaving of NA×NB bits mentioned above in detail with reference to FIG. 10 NC times, in the direction opposite to the second stage of interleaving mentioned above with reference to FIG. 9.

The data D71 obtained after the deinterleaving by the bit-wise deinterleaver 71 is outputted to the block-wise deinterleaver 72.

In step S35, the block-wise deinterleaver 72 performs the second stage of deinterleaving in units of blocks, which corresponds to the first stage of interleaving.

As mentioned above in detail with reference to FIG. 10, the block-wise deinterleaver 72 first performs deinterleaving A, performs deinterleaving B, and passes a product code as the deinterleaved data to the inner code decoding section 43. That is, the block-wise deinterleaver 72 first passes the blocks on which deinterleaving A has been performed, and then passes the blocks on which deinterleaving B has been performed, to the inner code decoding section 43.

In step S36, the inner code decoding section 43 performs, on the product code from the block-wise deinterleaver 72, decoding of the inner code corresponding to the encoding by the inner code encoding section 22, and outputs the decoded data to the outer code decoding section 44.

In step S37, the outer code decoding section 44 performs, on the data from the inner code decoding section 43, decoding of the outer code corresponding to the encoding by the outer code encoding section 21, and outputs the decoded data to an unillustrated subsequent stage.

In the above-described manner, data recorded on the recording medium 2 is reproduced.

[Specific Example of Effects]

Figure 12:
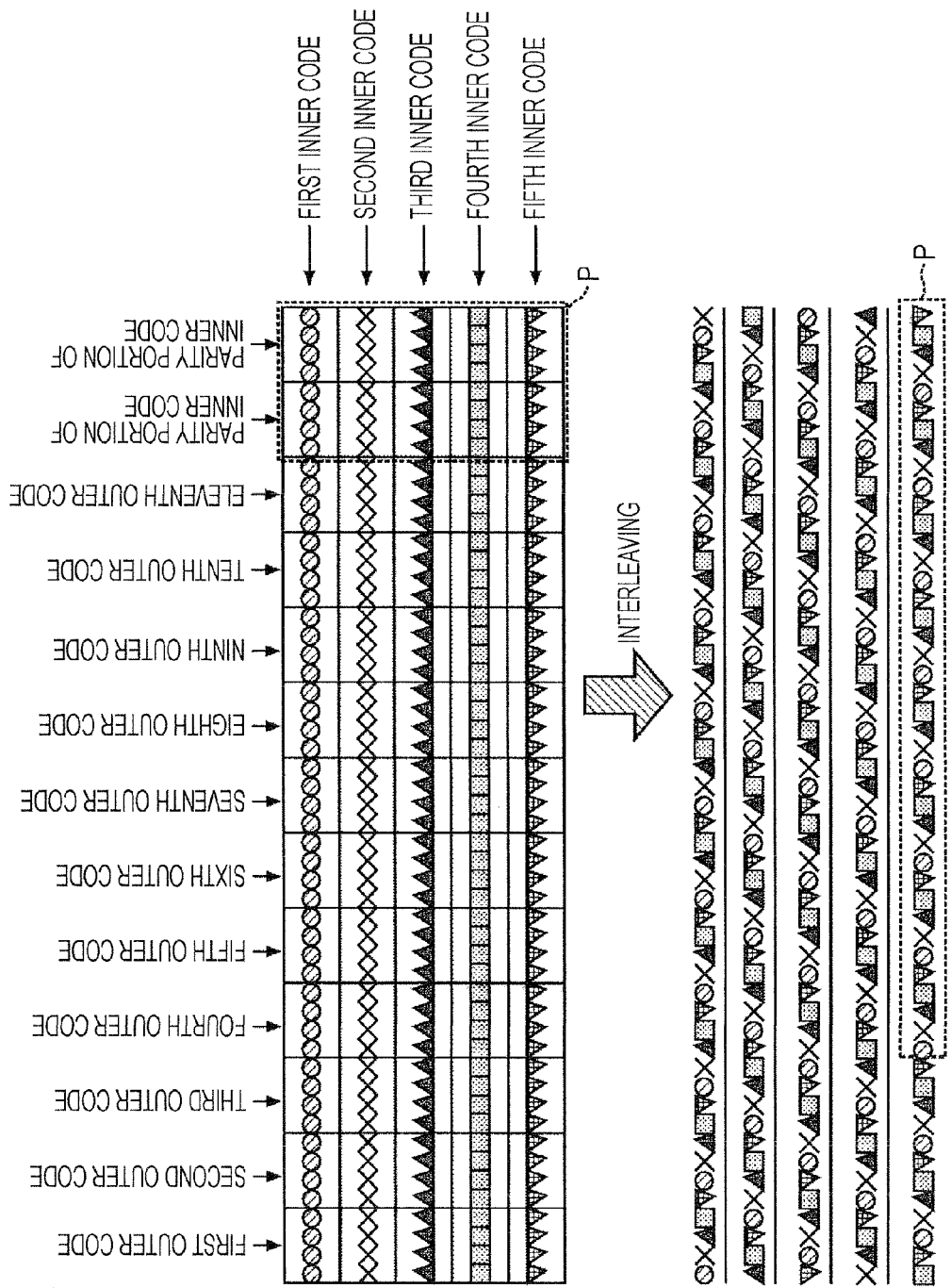
FIG. 12 is a diagram illustrating an example of interleaving by a recording/reproducing apparatus.
Figure 13:
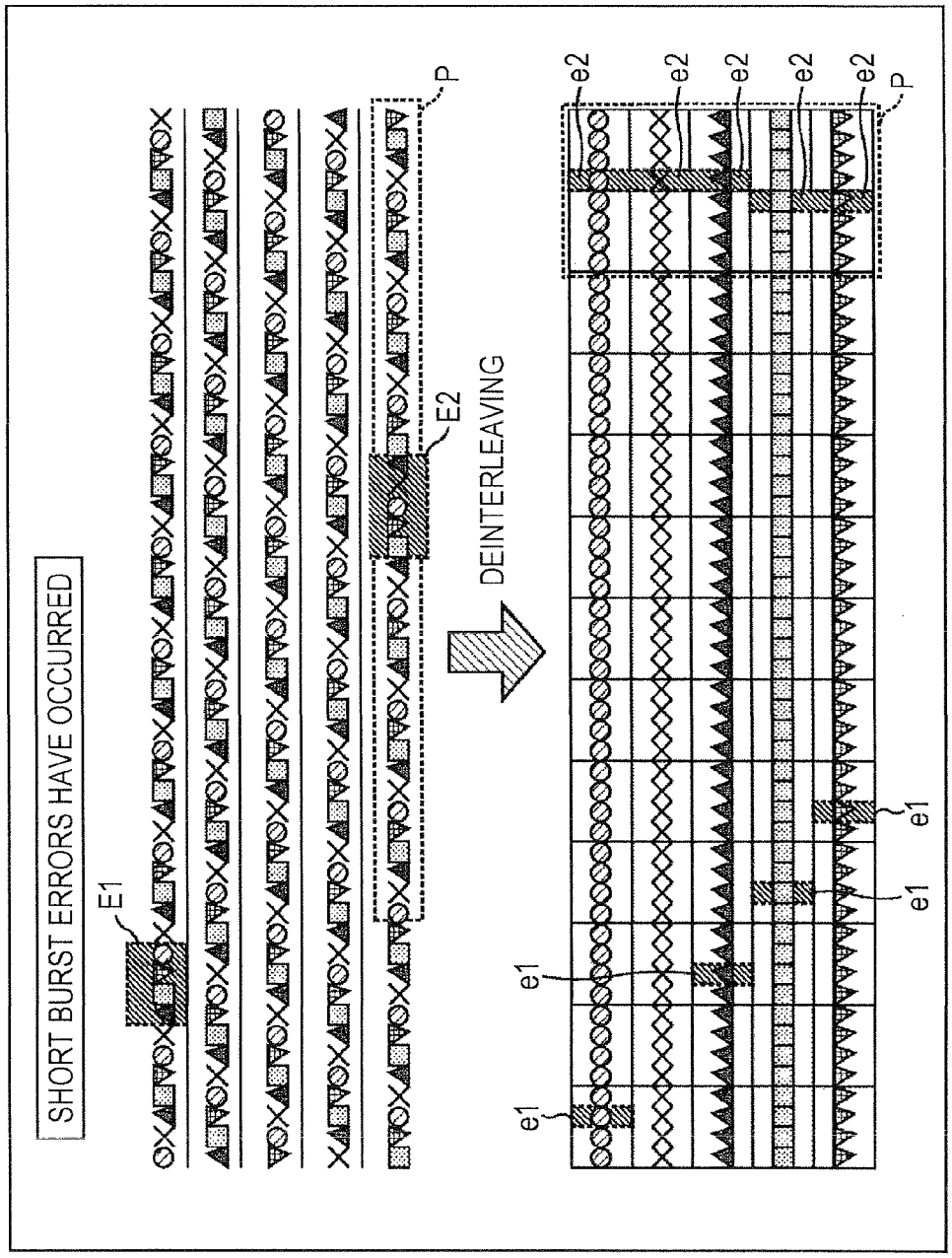
FIG. 13 is a diagram for explaining an effect in the case where short burst errors have occurred.
Figure 14:
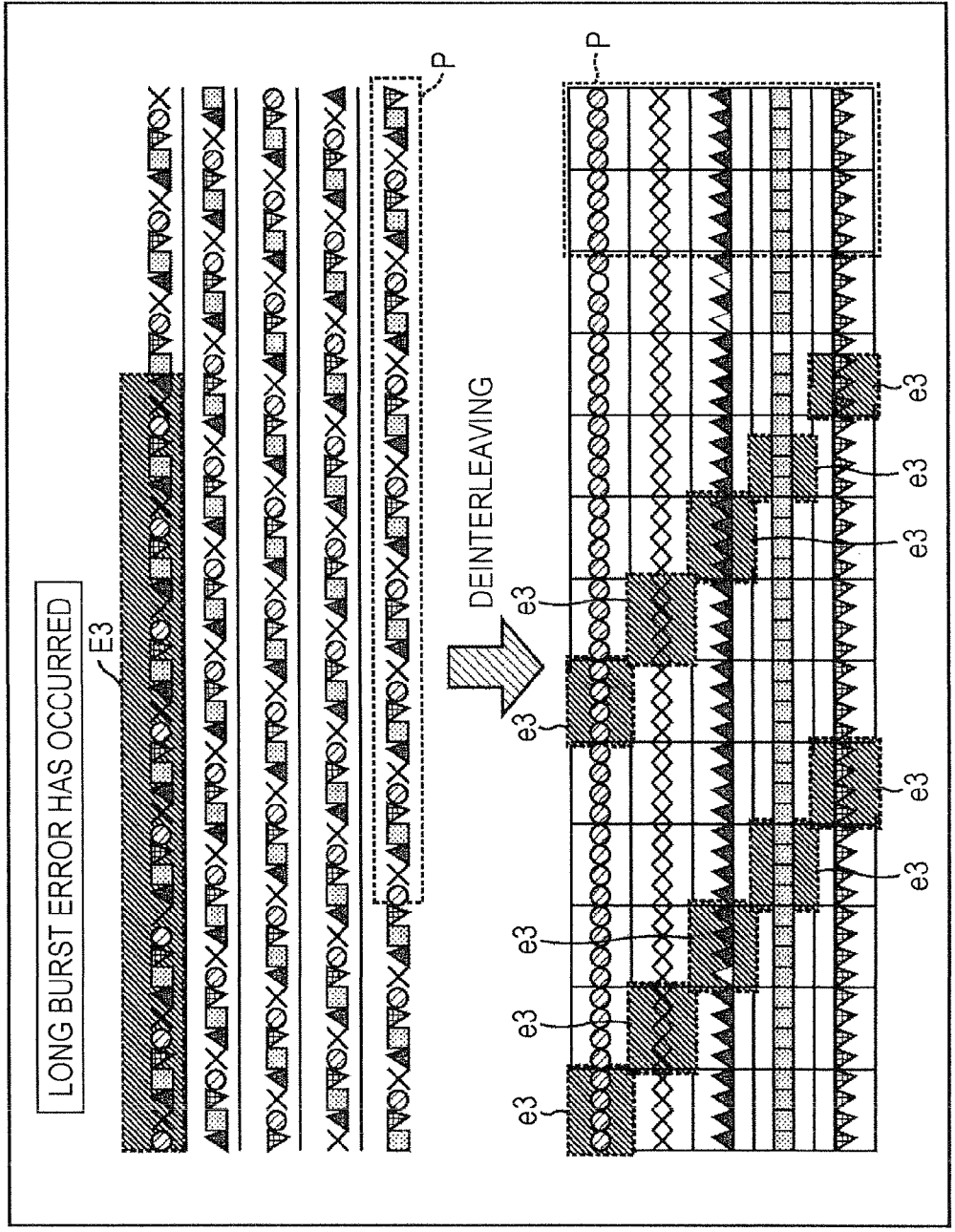
FIG. 14 is a diagram for explaining an effect in the case where a long burst error has occurred.

Next, referring to FIGS. 12 to 14, the effects of interleaving and deinterleaving by the recording/reproducing apparatus 1 will be described. In FIGS. 12 to 14, an example in the case of NA=5, NB=n=4, NC=13, and ND=11 is illustrated.

FIG. 12 is a diagram illustrating a product code inputted to the RAM of the block-wise interleaver 51 in the order of the column direction, and data obtained as a result of interleaving performed on the product code (that is, in the order of recording to the recording medium 2). FIG. 13 is a diagram illustrating data in which short burst errors have occurred after the data is subjected to the interleaving in FIG. 12, recorded to the recording medium 2, and read from the recording medium 2, and a product code obtained as a result of the data being deinterleaved and rearranged into the original order. FIG. 14 is a diagram illustrating data in which a long burst error has occurred after the data is subjected to the interleaving in FIG. 12, recorded to the recording medium 2, and read from the recording medium 2, and a product code obtained as a result of the data being deinterleaved and rearranged into the original order.

In the case of the example in FIG. 12, the product code includes NC=13 blocks of the outer code in the column direction (horizontal direction in the drawing), and includes NA=5 pieces of the inner code in the row direction. The circle marks illustrated in the first inner code represent bits of the first inner code, and the × marks illustrated in the second inner code represent bits of the second inner code. Likewise, the upward-pointing triangle marks illustrated in the third inner code represent bits of the third inner code, the square marks illustrated in the fourth inner code represent bits of the fourth inner code, and the downward-pointing triangle marks illustrated in the fifth inner code represent bits of the fifth inner code.

That is, the code length of one piece of the inner code is 52 bits, which is made up of NC=13 blocks with NB=4 bits as one block in each piece of the inner code. Also, ND=11 blocks out of the NC=13 blocks of the outer code which constitutes each piece of the inner code is a user data portion, and NC−ND (=2) blocks indicated by P is the parity portion of the inner code.

The block-wise interleaver 51 performs interleaving A on ND×NB×NA (=11×4×5) bits, which represents the user data portion of this product code. In interleaving A, data is inputted NB=4 bits by 4 bits (=block by block) to the RAM in the order of the column direction as one direction. Then, data inputted to the RAM is read in the order of the direction diagonally downward to the right in the drawing.

Next, the block-wise interleaver 51 performs interleaving B on the portion of this product code excluding the user data portion, that is, (NC−ND)×NB×NA (=2×4×5) bits representing the parity portion of the inner code indicated by P. In interleaving B, data is inputted NB=4 bits by 4 bits (=block by block) to the RAM in the order of the column direction (horizontal direction in the drawing) as one direction, and the inputted data in the RAM is read in the order of the row direction (vertical direction in the drawing) as the other direction.

Then, further, the bit-wise interleaver 52 performs bit-wise interleaving that permutes bits, NC=13 times for every 5 blocks as a group of NA=5 blocks (NB=4 bits) whose order has been changed by the block-wise interleaver 51. That is, with respect to the blocks that have been changed in their order by the block-wise interleaver 51, the bit-wise interleaver 52 performs processing in serial order for every 5 blocks, and within the range of 5 blocks, outputs the first bit of each of the blocks in order, then outputs the second bit of each of the blocks in order, thereafter repeats the same processing, and lastly, outputs the (NB=4)-th bit of each of the blocks in order, thereby changing the recording order.

As the first and second stages of interleaving are performed in order in the above-described manner, in the data obtained as a result (that is, in the order of recording to the recording medium 2), the data sequence has been permuted in such a way that the same codeword of the inner code does not appear twice in i=NA=5 consecutive blocks.

Also, at the same time, in the user data portion of the data, the data sequence has been permuted in such a way that different symbols of the same codeword of the outer code do not appear in j=NA×NB×NE consecutive bits (NE is the largest integer that satisfies NA×NE≦ND). That is, in the case of the example in FIG. 12, NE=2, and the data sequence has been permuted in such a way that different symbols of the same codeword of the outer code do not appear in j=NB×NA×NE=4×5×2=40 consecutive bits.

Here, suppose that as illustrated in FIG. 13, short burst errors have occurred in the data obtained as a result of performing the interleaving in FIG. 12, due to error propagation in PRML or the like. For example, in the example in FIG. 13, a short burst error indicated by E1 has occurred in 4 bits in the user data portion of the interleaved data. Also, a short burst error indicated by E2 has occurred in 5 bits in the parity portion of the inner code indicated by P.

With respect to the data in which the short burst errors indicated by E1 and E2 have occurred in this way, the bit-wise deinterleaver 71 performs deinterleaving of NA×NB (=5×4) bits NC (=13) times. That is, the bit-wise deinterleaver 71 performs processing in serial order for every NB=4 blocks with NA=5 bits as one block, and within the range of NB=4 blocks, outputs the first bit of each of the blocks in order, then outputs the second bit of each of the blocks in order, and repeats the same processing thereafter, and lastly, outputs the (NA=5)-th bit of each of the blocks in order, thereby rearranging data.

Further, the block-wise deinterleaver 72 performs deinterleaving A, and performs deinterleaving B, on the blocks that have been changed in their order by the bit-wise deinterleaver 71. That is, in deinterleaving A, data is inputted in the order of the direction diagonally downward to the right, which is the output order in interleaving A, and data in the RAM is outputted in the order of the column direction, which is the input order in interleaving A. Also, in deinterleaving B, data is inputted in the order of the row direction, which is the output order in interleaving B, and the inputted data in RAM is read in the order of the column direction, which is the input order in interleaving B.

As a result of the above deinterleaving, in the product code that has been rearranged into the original order, the short burst error indicated by E1 which has occurred in the user data portion after interleaving becomes a random error with respect to both the inner code arranged in the row direction and the outer code arranged in the column direction, as indicated by e1.

Also, the short burst error indicated by E2 which has occurred in the parity portion of the inner code becomes a random error only with respect to the inner code arranged in the row direction, and does not become a random error with respect to the outer code, as indicated by e2.

It should be noted, however, that as mentioned above with reference to FIG. 7, this parity portion of the inner code is a portion where decoding by the outer code is not performed, and thus the error needs not necessarily be changed into a random error. That is, although the NA×ND×NB bits subject to interleaving A include bits on which decoding by the outer code is to be performed, decoding by the outer code is not performed for the remaining bits ((NC−ND)×NA×NB bits subject to interleaving B).

Therefore, in actuality, the fact that in the data in the recording order, j consecutive bits do not span a plurality of symbols of the same codeword of the outer code is true only for the first NA×ND×NB bits. However, since the remaining bits are not subject to decoding by the outer code in the first place, as a whole, this is synonymous to saying that j consecutive bits do not span a plurality of symbols of the same codeword of the outer code.

On the other hand, suppose that as illustrated in FIG. 14, a long burst error has occurred in the data obtained as a result of performing the interleaving in FIG. 12, due to scratches, dust, or the like on the disc.

In the example in FIG. 14, a long burst error indicated by E3 has occurred in 38 bits in the user data portion of the interleaved data.

With respect to the data in which the long burst error indicated by E3 has occurred in this way, the bit-wise deinterleaver 71 performs deinterleaving of NA×NB bits NC times. Further, the block-wise deinterleaver 72 performs deinterleaving A, and performs deinterleaving B, on the blocks that have been changed in their order by the bit-wise deinterleaver 71. It should be noted that details of these deinterleaving are omitted to avoid repetition, since basically the same processing as the deinterleaving mentioned above with reference to FIG. 13 is performed.

As a result of the above deinterleaving, in the product code that has been rearranged into the original order, as indicated by e3, the long burst error indicated by E3 which has occurred in the user data portion after interleaving is scattered to some extent with respect to the inner code arranged in the row direction, and becomes an error of one symbol with respect to the outer code arranged in the column direction. That is, the long burst error can be changed into a random error with respect to the outer code.

Therefore, even when decoding of the inner code fails due to a long burst error, for the outer code, decoding can be performed effectively as a random error.

Figure 15:
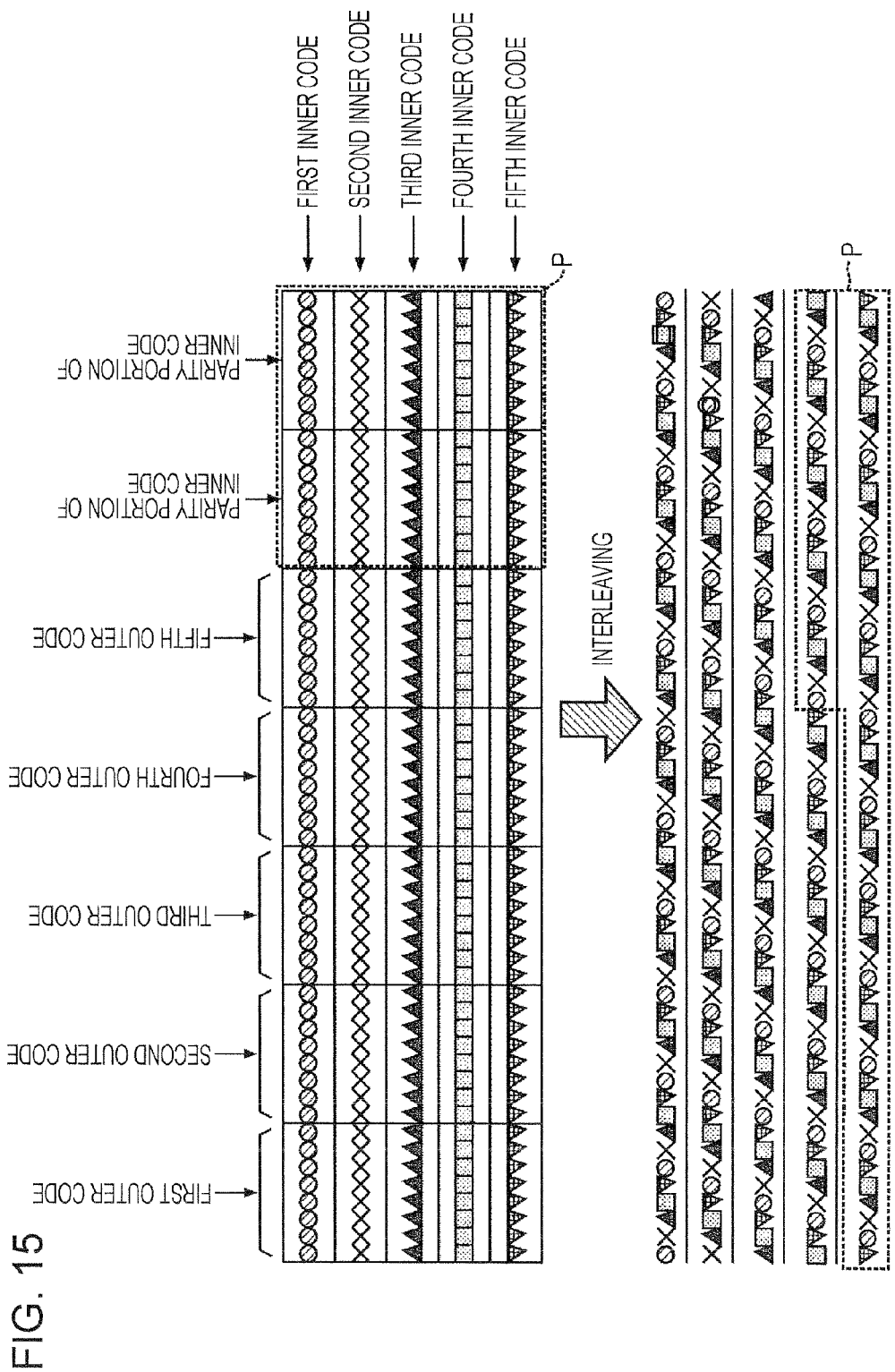
FIG. 15 is a diagram illustrating another example of interleaving by a recording/reproducing apparatus.
Figure 16:
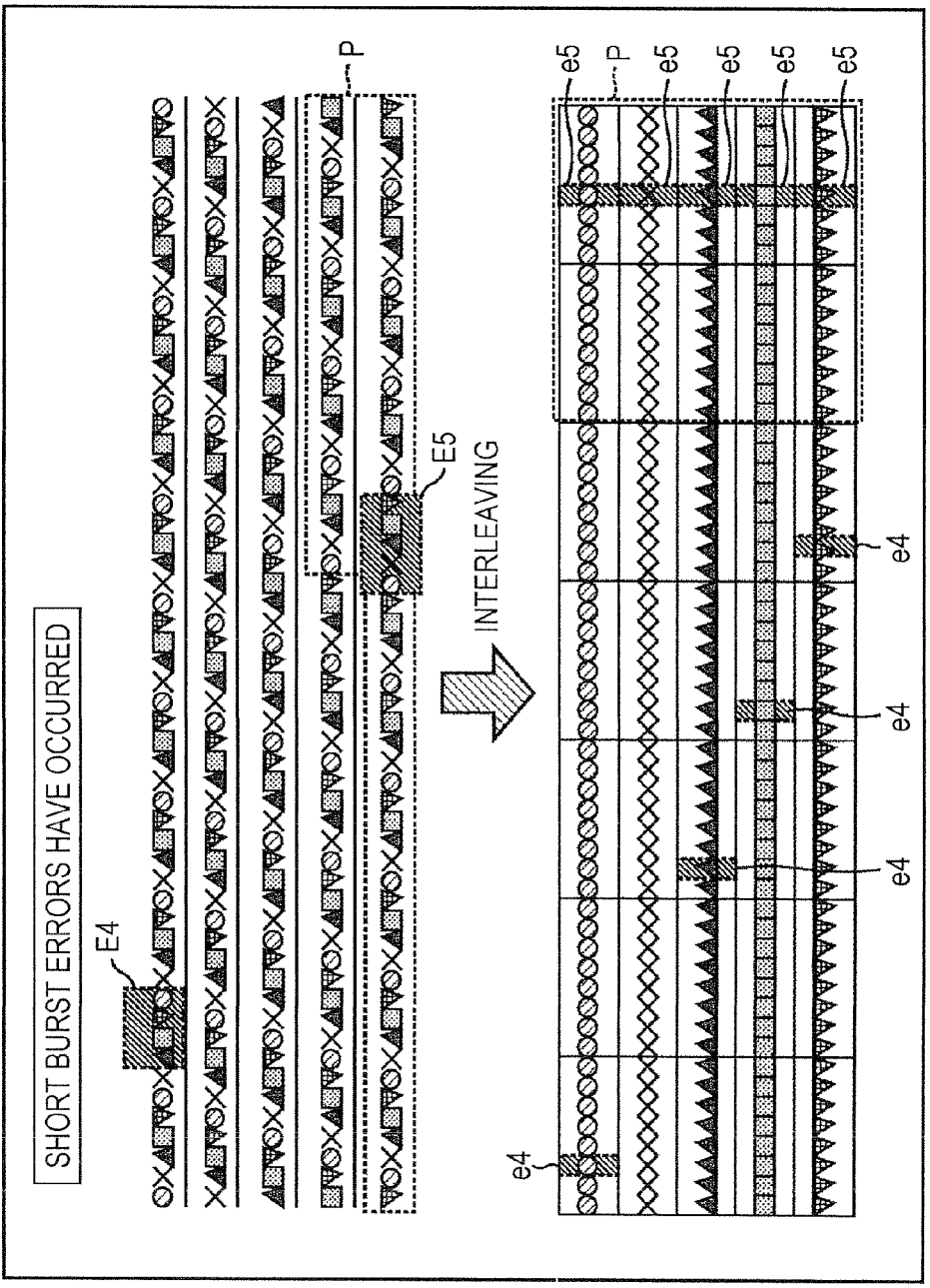
FIG. 16 is a diagram for explaining an effect in the case where short burst errors have occurred.
Figure 17:
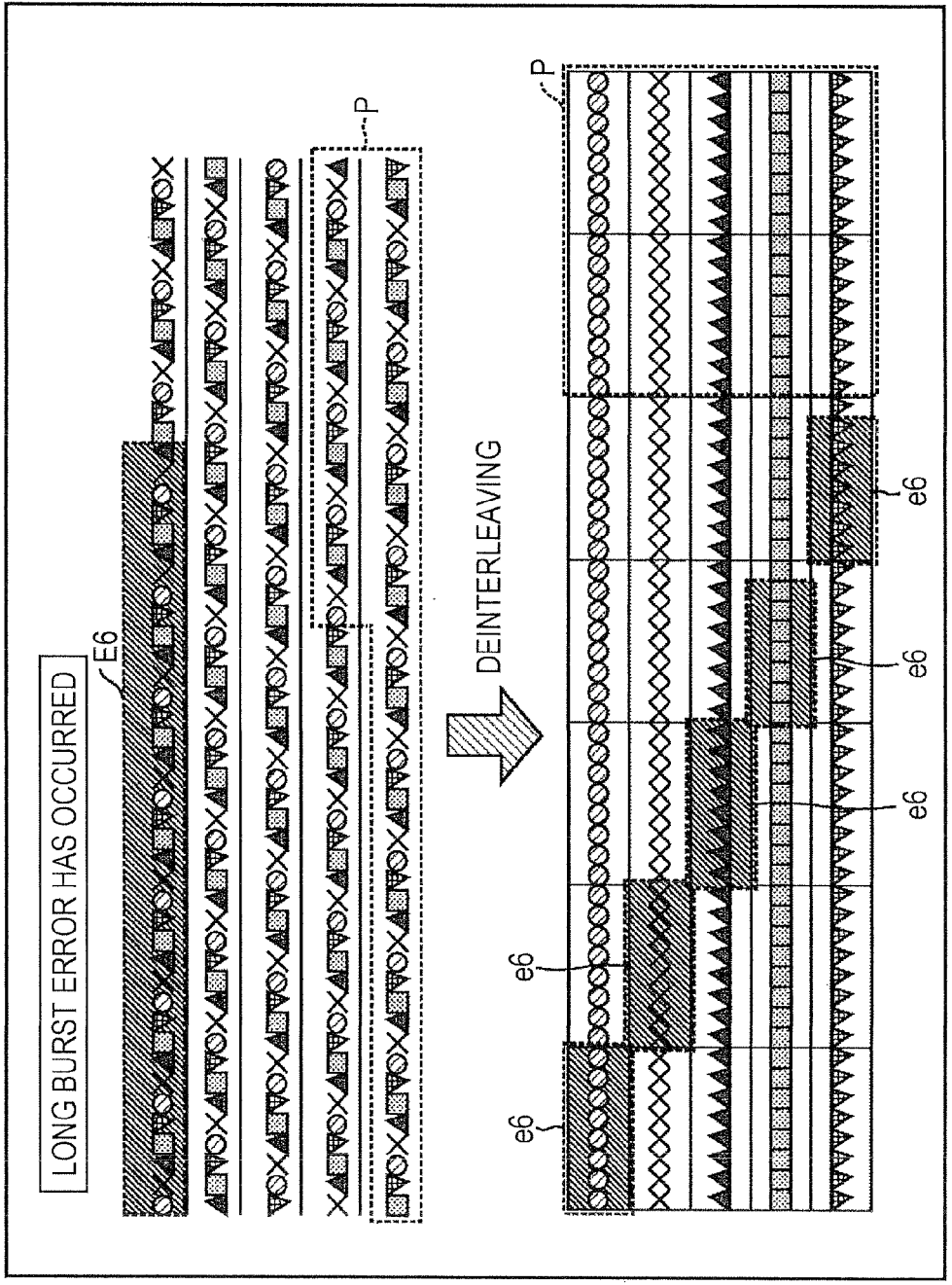
FIG. 17 is a diagram for explaining an effect in the case where a long burst error has occurred.

Next, referring to FIGS. 15 to 17, the effects of the interleaver 23 and the deinterleaver 42 will be further described. In FIGS. 15 to 17, an example in the case of NA=5, NB=n=8, NC=7, and ND=5 is illustrated.

FIG. 15 is a diagram illustrating a product code inputted to the RAM of the block-wise interleaver 51 in the order of the column direction, and data obtained as a result of interleaving performed on the product code (that is, in the order of recording to the recording medium 2). FIG. 16 is a diagram illustrating data in which short burst errors have occurred after the data is subjected to the interleaving in FIG. 15, recorded to the recording medium 2, and read from the recording medium 2, and a product code obtained as a result of the data being deinterleaved and rearranged into the original order. FIG. 17 is a diagram illustrating data in which a long burst error has occurred after the data is subjected to the interleaving in FIG. 15, recorded to the recording medium 2, and read from the recording medium 2, and a product code obtained as a result of the data being deinterleaved and rearranged into the original order.

In the case of the example in FIG. 15, the product code includes NC=7 blocks of the outer code in the column direction (horizontal direction in the drawing), and includes NA=5 pieces of the inner code in the row direction. The circle marks illustrated in the first inner code represent bits of the first inner code, and the × marks illustrated in the second inner code represent bits of the second inner code. Likewise, the upward-pointing triangle marks illustrated in the third inner code represent bits of the third inner code, the square marks illustrated in the fourth inner code represent bits of the fourth inner code, and the downward-pointing triangle marks illustrated in the fifth inner code represent bits of the fifth inner code.

That is, the code length of one piece of the inner code is 56 bits, which is made up of NC=7 blocks with NB=8 bits as one block in each piece of the inner code. Also, ND=5 blocks out of the NC=7 blocks of the outer code which constitutes each piece of the inner code is a user data portion, and NC−ND (=2) blocks indicated by P is the parity portion of the inner code.

The block-wise interleaver 51 performs interleaving A on ND×NB×NA (=5×8×5) bits, which represents the user data portion of this product code. In interleaving A, data is inputted NB=8 bits by 8 bits (=block by block) in the order of the column direction as one direction. Then, for example, data in the RAM is read in the order of the direction diagonally downward to the right in the drawing.

Next, the block-wise interleaver 51 performs interleaving B on the portion of this product code excluding the user data portion, that is, (NC−ND)×NB×NA (=2×8×5) bits which is the parity portion of the inner code indicated by P. In interleaving B, data is inputted NB=8 bits by 8 bits (=block by block) to the RAM in the order of the column direction (horizontal direction in the drawing) as one direction, and the inputted data in the RAM is read in the order of the row direction (vertical direction in the drawing) as the other direction.

Then, further, the bit-wise interleaver 52 performs bit-wise interleaving that permutes bits, NC=7 times for every 5 blocks as a group of NA=5 blocks (NB=8 bits) whose order has been changed by the block-wise interleaver 51. That is, with respect to the blocks that have been changed in their order by the block-wise interleaver 51, the bit-wise interleaver 52 performs processing in serial order for every 5 blocks, and within the range of 5 blocks, outputs the first bit of each of the blocks in order, then outputs the second bit of each of the blocks in order, thereafter repeats the same processing, and lastly, outputs the (NB=8)-th bit of each of the blocks in order, thereby changing the recording order.

As the first and second stages of interleaving are performed in order in the above-described manner, in the data obtained as a result (that is, in the order of recording to the recording medium 2), the data sequence has been permuted in such a way that the same codeword of the inner code does not appear twice in i=NA=5 consecutive blocks.

Also, at the same time, in the user data portion of the data, the data sequence has been permuted in such a way that different symbols of the same codeword of the outer code do not appear in j=NA×NB×NE consecutive bits (NE is the largest integer that satisfies NA×NE≦ND). That is, in the case of the example in FIG. 15, NE=1, and the data sequence has been permuted in such a way that different symbols of the same codeword of the outer code do not appear in j=NB×NA× NE=8×5×1=40 consecutive bits.

Here, suppose that as illustrated in FIG. 16, short burst errors have occurred in the data obtained as a result of performing the interleaving in FIG. 15, due to error propagation in PRML or the like. For example, in the example in FIG. 16, a short burst error indicated by E4 has occurred in 4 bits in the user data portion of the interleaved data. Also, a short burst error indicated by E5 has occurred in 5 bits in the parity portion of the inner code indicated by P.

With respect to the data in which the short burst errors indicated by E4 and E5 have occurred in this way, the bit-wise deinterleaver 71 performs deinterleaving of NA×NB (=5×8) bits NC (=7) times. That is, the bit-wise deinterleaver 71 performs processing in serial order for every NB=8 blocks with NA=5 bits as one block, and within the range of NB=8 blocks, outputs the first bit of each of the blocks in order, then outputs the second bit of each of the blocks in order, and repeats the same processing thereafter, and lastly, outputs the (NA=5)-th bit of each of the blocks in order, thereby rearranging data.

Further, the block-wise deinterleaver 72 performs deinterleaving A, and performs deinterleaving B, on the blocks that have been changed in their order by the bit-wise deinterleaver 71. That is, in deinterleaving A, data is inputted in the order of the direction diagonally downward to the right, which is the output order in interleaving A, and data in the RAM is outputted in the order of the column direction, which is the input order in interleaving A. Also, in deinterleaving B, data is inputted in the order of the row direction, which is the output order in interleaving B, and the inputted data in RAM is read in the order of the column direction, which is the input order in interleaving B.

As a result of the above deinterleaving, in the product code that has been rearranged into the original order, the short burst error indicated by E4 which has occurred in the user data portion becomes a random error with respect to both the inner code arranged in the row direction and the outer code arranged in the column direction, as indicated by e4.

Also, as in the example in FIG. 13 mentioned above, the short burst error indicated by E5 which has occurred in the parity portion of the inner code becomes a random error only with respect to the inner code arranged in the row direction, as indicated by e5.

On the other hand, suppose that as illustrated in FIG. 17, a long burst error has occurred in the data obtained as a result of performing the interleaving in FIG. 15, due to scratches, dust, or the like on the disc. In the example in FIG. 17, a long burst error indicated by E6 has occurred in 38 bits in the user data portion of the interleaved data.

With respect to the data in which the long burst error indicated by E6 has occurred in this way, the bit-wise deinterleaver 71 performs deinterleaving of NA×NB bits NC times. Further, the block-wise deinterleaver 72 performs deinterleaving A, and performs deinterleaving B, on the blocks that have been changed in their order by the bit-wise deinterleaver 71. It should be noted that details of these deinterleaving are omitted to avoid repetition, since basically the same processing as the deinterleaving mentioned above with reference to FIG. 16 is performed.

As a result of the above deinterleaving, in the product code that has been rearranged into the original order, as indicated by e6, the long burst error indicated by E6 which has occurred in the user data portion after interleaving is scattered to some extent with respect to the inner code arranged in the row direction, and can be changed into a random error with respect to the outer code arranged in the column direction.

Therefore, even when decoding of the inner code fails due to a long burst error, for the outer code, decoding can be performed effectively as a random error.

As described above, according to the interleaver 23 and the deinterleaver 42 of the recording/reproducing apparatus 1, very effective error correction can be performed. It should be noted that while the example mentioned above with reference to FIGS. 12 to 17 is an example in which the code length of the inner code is very short, if a long code length is set for the inner code, even when a long burst error has occurred, it is also possible to change the error into a random error with respect to the outer code.

Also, by performed interleaving and deinterleaving in the above-described manner, the cycle of interleaving can be made small with respect to one code's worth of the product code.

The series of processes mentioned above can be either executed by hardware or executed by software. If the series of processes is to be executed by software, a program constituting the software is installed into a computer embedded in dedicated hardware, a general-purpose personal computer, or the like from a program-recording medium.

FIG. 18 is a block diagram showing an example of the hardware configuration of a computer that executes the above-mentioned series of processes.

A CPU (Central Processing Unit) 101, a ROM (Read Only Memory) 102, and a RAM (Random Access Memory) 103 are connected to each other via a bus 104.

The bus 104 is further connected with an input/output interface 105. The input/output interface 105 is connected with an input section 106 formed by a keyboard, a mouse, or the like, an output section 107 formed by a display, a speaker, or the like. Also, the bus 104 is connected with a storing section 108 formed by a hard disk, a non-volatile memory, or the like, a communication section 109 formed by a network interface or the like, and a drive 110 for driving a removable medium 111.

In the computer configured as described above, the above-mentioned series of processes is performed when the CPU 101 loads a program stored in the storing section 108 into the RAM 103 via the input/output interface 105 and the bus 104, and executes the program, for example.

The program executed by the CPU 101 is provided by being recorded on the removable medium 111, or via a wired or wireless transmission medium such as a local area network, Internet, or digital satellite broadcast, and installed into the storing section 108, for example.

It should be noted that the program executed by the computer may be a program in which processes are performed in a time-series fashion in the order as described in this specification, or may be a program in which processes are performed in parallel, or at necessary timing such as when invoked.

Embodiments of the present invention are not limited to the above-mentioned embodiments, and various modifications are possible without departing from the scope of the present invention.

Reference Signs List 1 recording/reproducing apparatus
2 recording medium
21 outer code encoding section
22 inner code encoding section
23 interleaver
31 recording/reproducing section
32 equalization section
42 deinterleaver
43 inner code decoding section
44 outer code decoding section
51 block-wise interleaver
52 bit-wise interleaver
71 bit-wise deinterleaver
72 block-wise deinterleaver

The invention claimed is:

1. A data processing apparatus having a processor, comprising:
    an interleaver for performing interleaving on a product code to change a recording order, the product code being encoded in the order of an outer code and an inner code by using, as the outer code, a code that performs error correction in units of symbols with n bits as one symbol, and using, as the inner code, a code that performs error correction in units of bits,
    wherein in the recording order after the interleaving is performed by the interleaver, the same codeword of the inner code is not included in i consecutive bits, and j (j>i) consecutive bits do not span a plurality of symbols of the same codeword of the outer code, i representing the number of pieces of the inner codes included in one product code and j representing a predetermined integral multiple of the of i and n.

2. The data processing apparatus according to claim 1, wherein the interleaver includes:
    a first interleaver for performing first interleaving of NA×NC blocks with NB (NB=n) bits as one block, by using NA pieces of the inner code; and
    a second interleaver for performing second interleaving of NA×NB bits NC times in units of bits, after the first interleaving by the first interleaver,
    wherein NA represents the number of pieces of inner codes of one product code, NB represents the number of bits of one unit, and NC represents the number of units of one piece of the inner code.

3. The data processing apparatus according to claim 2, wherein the first interleaver performs the first interleaving by outputting the NA×NC blocks, which are inputted in the order of one direction, in the order of a diagonal direction.

4. The data processing apparatus according to claim 2, wherein:
the first interleaving by the first interleaver includes:
interleaving in units of ND×NB×NA bits (ND×NB ≧ information length of the inner code), ND representing the number of units of user data in a row direction, and
interleaving of a portion of the product code that has not been interleaved by the first interleaver; and
the first interleaver performs the first interleaving by outputting NA×ND blocks, which are inputted in the order of one direction, in the order of a diagonal direction, with respect to a range of the ND×NB×NA bits, and then outputting NA×(NC−ND) blocks, which are inputted in the order of the one direction, in the order of the other direction, with respect to a range of (NC−ND)×NB×NA bits.

5. The data processing apparatus according to claim 4, wherein NA and ND are disjoint.

6. The data processing apparatus according to claim 5, wherein letting the index of blocks generated by dividing the inner code in units of NB bits be x=0, 1, . . . , ND−1 in serial order, letting the index of the inner code be y=0, 1, NA−1 in serial order, letting the x-th block of the y-th inner code be (x, y), and letting k be a variable that counts the number of blocks to be read, with respect to the range of the ND×NB×NA bits, the first interleaver outputs, from the inner code with the smallest index, the blocks inputted in ascending order of the index of the blocks, in the order of blocks (x, y) represented by $x=(k \bmod ND)$ $y=(k \bmod NA)$ $k=0, 1, 2, \ldots, N-1.$ 7. The data processing apparatus according to claim 2, wherein the second interleaver performs the second interleaving by:
performing processing in serial order NA blocks by NA blocks, with respect to the blocks on which the first interleaving has been performed by the first interleaver, and
outputting, within a range of the NA blocks, the first bit of each of the blocks in order, then outputting the second bit of each of the blocks in order, thereafter repeating the same processing and lastly, outputting the NB-th bit of each of the blocks in order.

8. The data processing apparatus according to claim 2, wherein a cycle, of the interleaving is smaller than one codeword of the product code.

9. A data processing method performed by a processor that performs interleaving on a product code encoded in the order of an outer code and an inner code by using, as the outer code, a code that performs error correction in units of symbols with a bits as one symbol, and using, as the inner code, a code that performs error correction in units of bits. the ata processing method comprising the steps of:
performing the interleaving on the product code to change a recording order, so that in the recording order after the interleaving is performed, the same codeword of the inner code is not included in i consecutive bits, and j (j>i) consecutive Bits do not span a plurality of symbols of the same codeword of the outer code, i representing, the number of pieces of the inner codes included in one product code j representing a predetermined integral multiple of the product of i and n.

10. A non-transitory storage medium storing an executable program for causing a data processing apparatus to execute a data processing method, the data processing apparatus performing interleaving on a product code encoded in the order of an outer code and an inner code by using, as the outer code, a code that performs error correction in units of symbols with n bits as one symbol, and using, as the inner code, a code that performs error correction in units of bits, the data processing method comprising the steps of:
performing the interleaving on the product code to change a recording order, so that in the recording order after the interleaving is performed, the same codeword of the inner code is not included in i consecutive bits, and j(j>i) consecutive bits do not span a plurality of symbols of the same codeword of the outer code, i representing the number of pieces of the inner codes included in one product code and j representing a predetermined integral multiple of the product of i and n.

11. A data processing apparatus, comprising:
a deinterleaver for performing deinterleaving on data read from a recording medium on which the data is recorded, to rearrange the data into an original order, the data being obtained by performing interleaving on a product code, which is encoded in the order of an outer code and an inner code by using, as the outer code, a code that performs error correction in units of symbols with n bits as one symbol, and using, as the inner code, a code that performs error correction in units of bits, so that in a recording order after the interleaving is performed, the same codeword of the inner code is not included in i consecutive bits, and j (j>i) consecutive bits do not span a plurality of symbols of the same codeword of the outer code, i representing the number of pieces of the inner code included in one product code and j representing a predetermined integral multiple of the product i an n.

12. The data processing apparatus according to claim 11, wherein the deinterleaver includes:
a first deinterleaver for performing first deinterleaving of NA×NB bits NC times in units of bits; and
a second deinterleaver for performing second deinterleaving of NA×NC blocks with NB (NB=n) bits as one block, by using NA pieces of the inner code, after the first deinterleaving by the first deinterleaver,
wherein NA represents the number of pieces of inner codes of one product code, NB represents the number of bits of one unit and NC represents the number of units one piece of the inner code.

13. The data processing apparatus according to claim 12, wherein the second deinterleaver outputs the NA×NC blocks, which are inputted in the order of a diagonal direction, in the order of one direction.

14. The data processing apparatus according to claim 12, wherein:
the second deinterleaving by the second deinterleaver includes deinterleaving in units of ND×NB×NA bits (ND×NB ≧ information length of the inner code), and deinterleaving of a portion of the product code that has not been deinterleaved by the second deinterleaver, ND representing the number of units of user data in a row direction; and
the second deinterleaver outputs the NA×NC blocks, which are inputted in the order of a diagonal direction, in the order of one direction, with respect to a range of the ND×NB×NA bits, and then outputs NA×(NC−ND) blocks, which are inputted in the order of the other direction, in the order of the one direction, with respect to a range of (NC−ND)×NB×NA bits.

15. The data processing apparatus according to claim 14, wherein NA and ND are disjoint.

16. The data processing apparatus according to claim 15, wherein letting the index of blocks generated by dividing the inner code in units of NB bits be x=0, 1, ..., ND−1 in serial order, letting the index of the inner code be y =0, 1, ..., NA−1 in serial order, letting the x-th block of the y-th inner code be (x, y), and letting k he a variable that counts the number of blocks to he inputted, with respect to the range of the ND×NB×NA bits, the second deinterleaver inputs blocks (x, y) represented by $$x=(k \bmod ND)$$

$$y=(k \bmod NA)$$

k=0,1,2, ..., N−1 in order, and outputs them in ascending order of the index of the blocks, from the inner code with the smallest index.

17. The data processing apparatus according to claim 12, wherein the first deinterleaver processes in serial order NB blocks by NB blocks with NA bits as one block, and outputting, within a range of the NB blocks, the first bit of each of the blocks in order, then outputting the second bit of each of the blocks in order, thereafter repeating the same processing, and lastly, outputting the NA-th bit of each of the blocks in order.

18. The data processing apparatus according to claim 12, wherein a cycle of the interleaving is smaller than one codeword of the product code.

19. A data processing method performed by a data processing apparatus that includes a program that processes data read from a recording medium on which the data is recorded, the data being obtained by performing interleaving on a product code encoded in the e order of an outer code and an inner code by using, as the outer code, a code that performs error correction in units of symbols with n bits as one symbol, and using, as the inner code, a code that performs error correction in units of bits, the data processing method comprising steps of:

performing deinterleaving on data to rearrange the data into an original order, the data being read from the recording medium and subjected to the interleaving so that in a recording order after the interleaving is performed, the same codeword of the inner code is not included in i consecutive bits, and j (j>i) consecutive bits do not span a plurality of symbols of the same codeword of the outer code, i representing the number of pieces of the inner codes included in one product code and j representing a predetermined integral multiple of the product of i and n.

20. A non-transitory storage medium storing an executable program for causing a data processing apparatus to execute processing, the data processing apparatus processing data read from a recording medium on which the data is recorded, the data being obtained by performing interleaving on a product code encoded in the order of an outer code and an inner code by using, as the outer code, a code that performs error correction in units of symbols with n bits as one symbol, and using, as the inner code, a code that performs error correction in units of bits, the data processing method comprising the steps of:

performing deinterleaving on data to rearrange the data into an original order, the data being read from the recording medium and subjected to the interleaving so that in a recording order after the interleaving is performed, the same codeword of the inner code is not included in i consecutive bits, and j (j>i) consecutive bits do not span a plurality of symbols of the same codeword of the outer code, i representing; the number of pieces of the inner codes included in one product code and j representing a predetermined integral multiple of the product of i and n.

* * * * *